(12) United States Patent
Nakamura

(10) Patent No.: US 11,887,950 B2
(45) Date of Patent: Jan. 30, 2024

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventor: Takuya Nakamura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 259 days.

(21) Appl. No.: 17/293,198

(22) PCT Filed: Oct. 17, 2019

(86) PCT No.: PCT/JP2019/040915
§ 371 (c)(1),
(2) Date: May 12, 2021

(87) PCT Pub. No.: WO2020/105331
PCT Pub. Date: May 28, 2020

(65) Prior Publication Data
US 2022/0005776 A1    Jan. 6, 2022

(30) Foreign Application Priority Data

Nov. 20, 2018 (JP) ................................ 2018-217455

(51) Int. Cl.
*H01L 23/00* (2006.01)
*H01L 27/146* (2006.01)
(52) U.S. Cl.
CPC ............. *H01L 24/06* (2013.01); *H01L 24/03* (2013.01); *H01L 24/04* (2013.01); *H01L 24/05* (2013.01); *H01L 27/14634* (2013.01); *H01L 27/14636* (2013.01); *H01L 27/14685* (2013.01); *H01L 27/1464* (2013.01); *H01L 27/14627* (2013.01);
(Continued)

(58) Field of Classification Search
None
See application file for complete search history.

(56) References Cited

U.S. PATENT DOCUMENTS

2006/0197007 A1    9/2006  Wabuchi et al.
2018/0166490 A1    6/2018  Wakiyama et al.
2018/0342558 A1   11/2018  Hirata et al.

FOREIGN PATENT DOCUMENTS

CN    1838423 A    9/2006
CN  107278328 A   10/2017
(Continued)

*Primary Examiner* — Douglas W Owens
(74) *Attorney, Agent, or Firm* — CHIP LAW GROUP

(57) ABSTRACT

A solid-state imaging device to be provided includes a first semiconductor device including a semiconductor layer in which a photoelectric conversion unit that photoelectrically converts incident light and a penetrating via are provided, a first connecting portion and a second connecting portion on the surface side of the semiconductor layer on the side that receives the light, and a connecting wiring line that connects the first connecting portion, the second connecting portion, and the penetrating via. The solid-state imaging device further includes a second semiconductor device that is mounted on the first semiconductor device with the first connecting portion. The solid-state imaging device is connected to an external terminal by the second connecting portion.

12 Claims, 24 Drawing Sheets

(52) U.S. Cl.
CPC ........... *H01L 2224/0239* (2013.01); *H01L 2224/02313* (2013.01); *H01L 2224/02372* (2013.01); *H01L 2224/02381* (2013.01); *H01L 2224/0345* (2013.01); *H01L 2224/0401* (2013.01); *H01L 2224/04042* (2013.01); *H01L 2224/05024* (2013.01); *H01L 2224/05073* (2013.01); *H01L 2224/05083* (2013.01); *H01L 2224/05157* (2013.01); *H01L 2224/05166* (2013.01); *H01L 2224/05186* (2013.01); *H01L 2224/05548* (2013.01); *H01L 2224/05573* (2013.01); *H01L 2224/05624* (2013.01); *H01L 2224/05647* (2013.01); *H01L 2224/0601* (2013.01); *H01L 2224/06505* (2013.01); *H01L 2924/04941* (2013.01)

(56) References Cited

FOREIGN PATENT DOCUMENTS

| | | | |
|---|---|---|---|
| EP | 3268990 A1 | 1/2018 | |
| JP | 2007-013089 A | 1/2007 | |
| JP | 2016-171297 * | 9/2016 | ......... H01L 21/6835 |
| JP | 2016-171297 A | 9/2016 | |
| JP | 2018-152393 A | 9/2018 | |
| KR | 10-2006-0096924 A | 9/2006 | |
| KR | 10-2017-0124538 A | 11/2017 | |
| TW | 201633524 A | 9/2016 | |
| WO | 2016/104177 A1 | 6/2016 | |
| WO | 2016/143288 A1 | 9/2016 | |
| WO | WO-2016143288 A1 * | 9/2016 | ......... H01L 21/6835 |
| WO | 2018/163720 A1 | 9/2018 | |

* cited by examiner

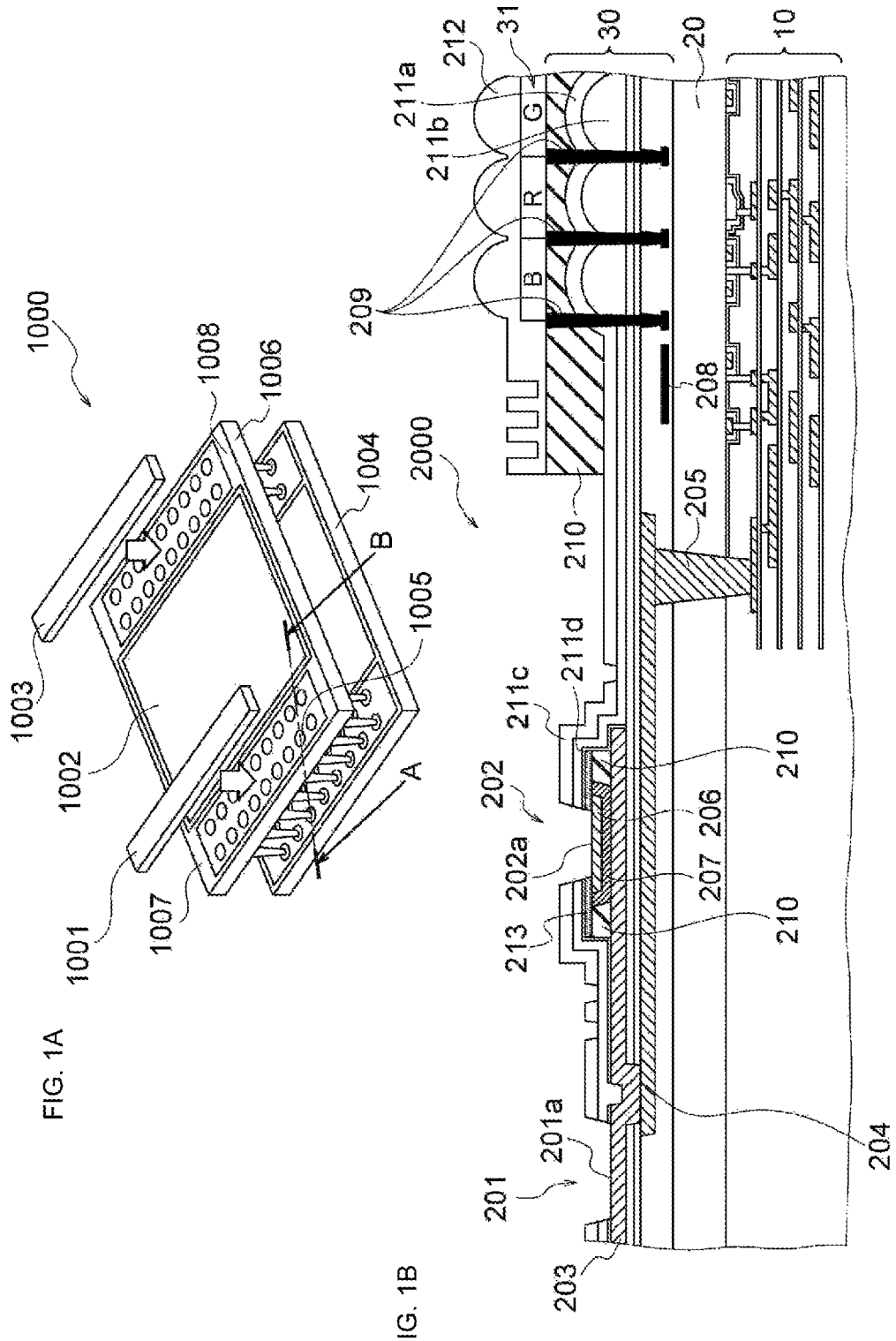

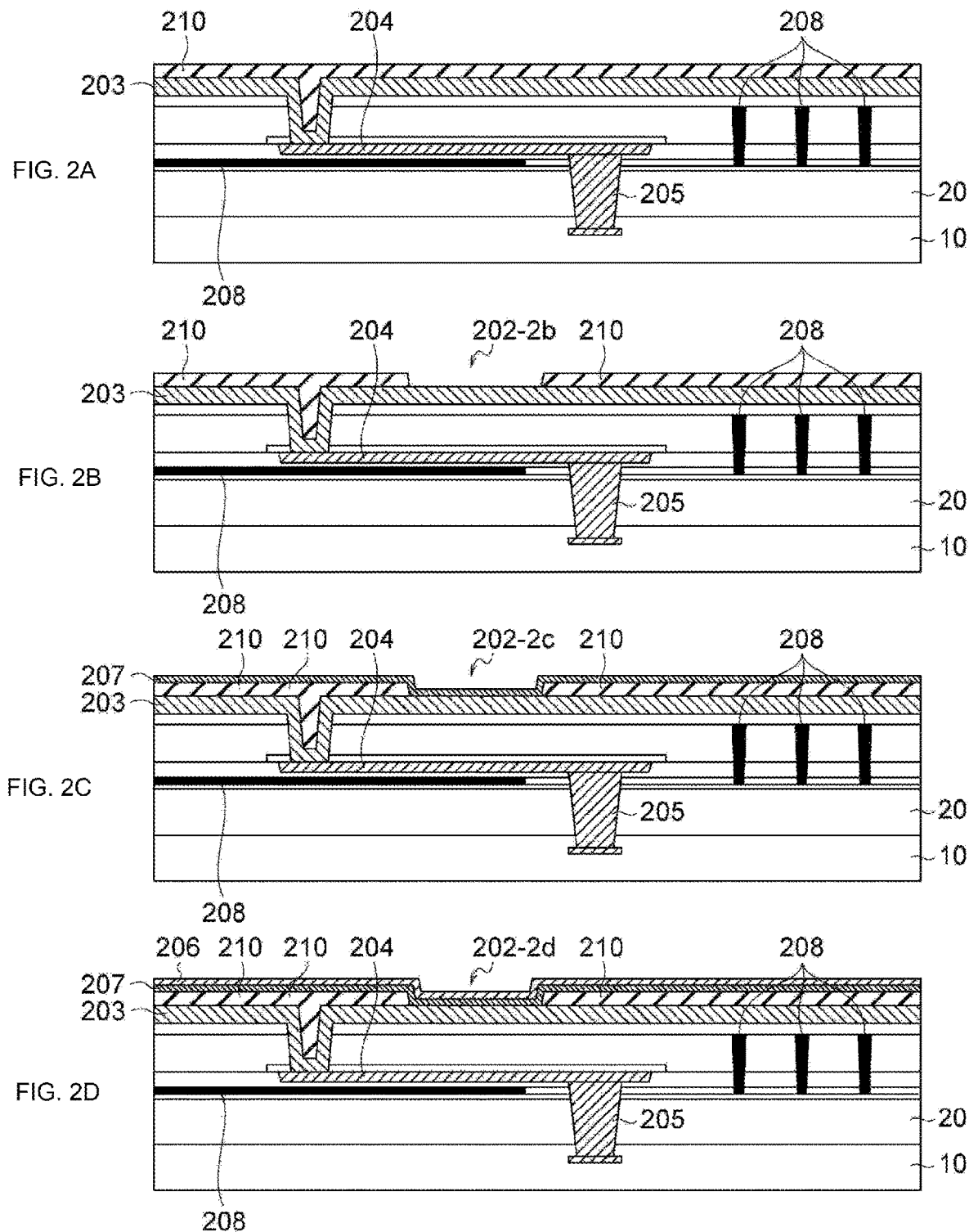

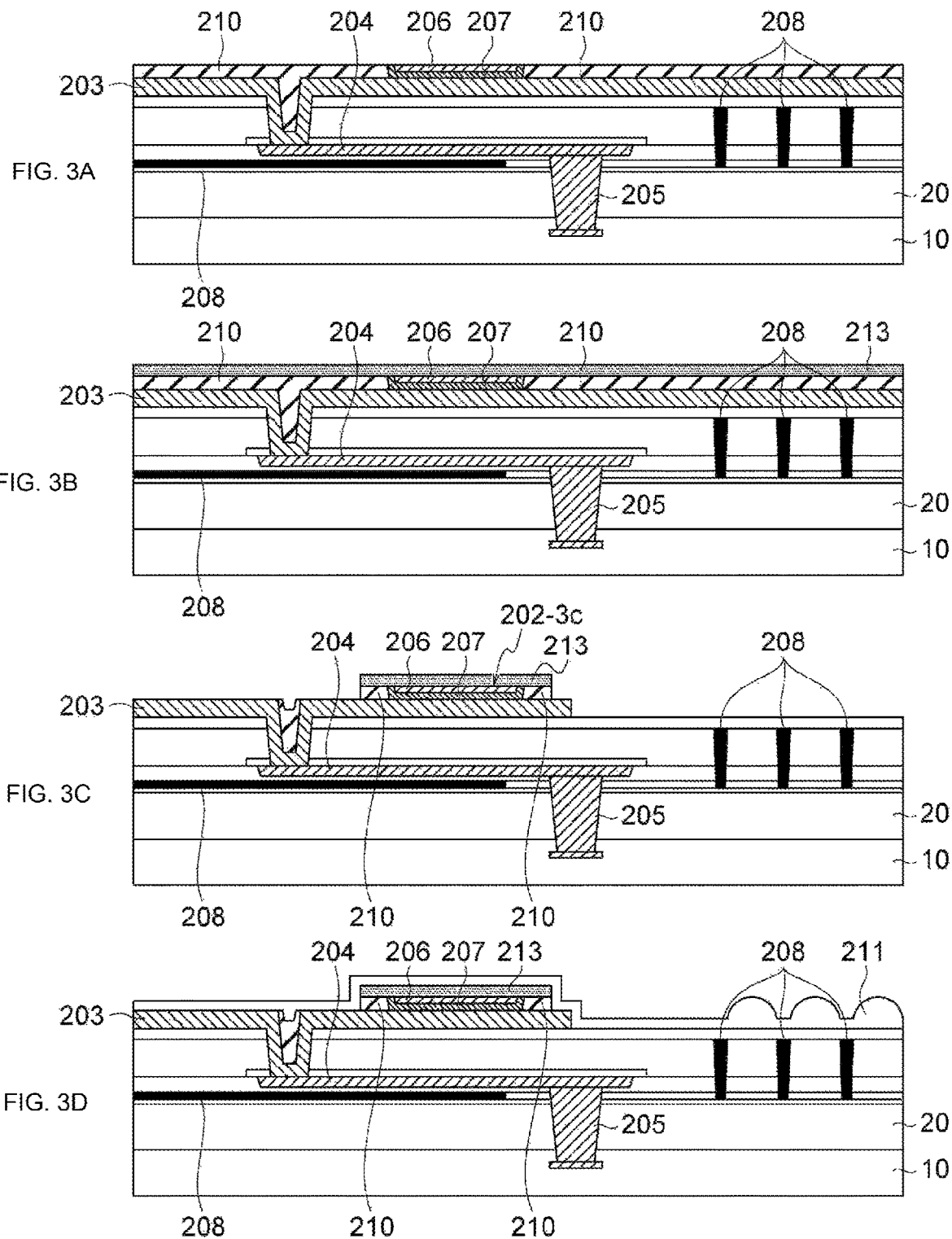

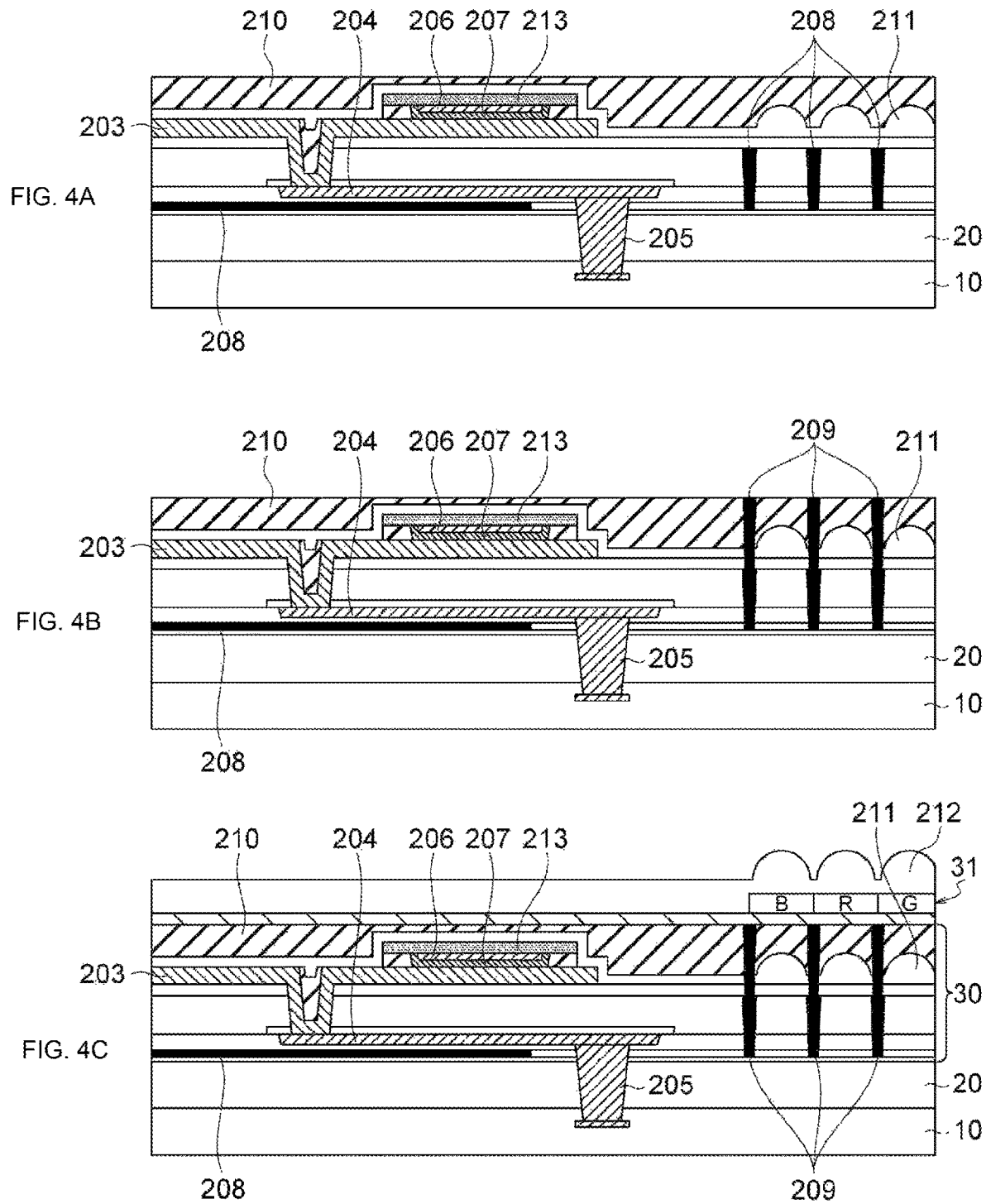

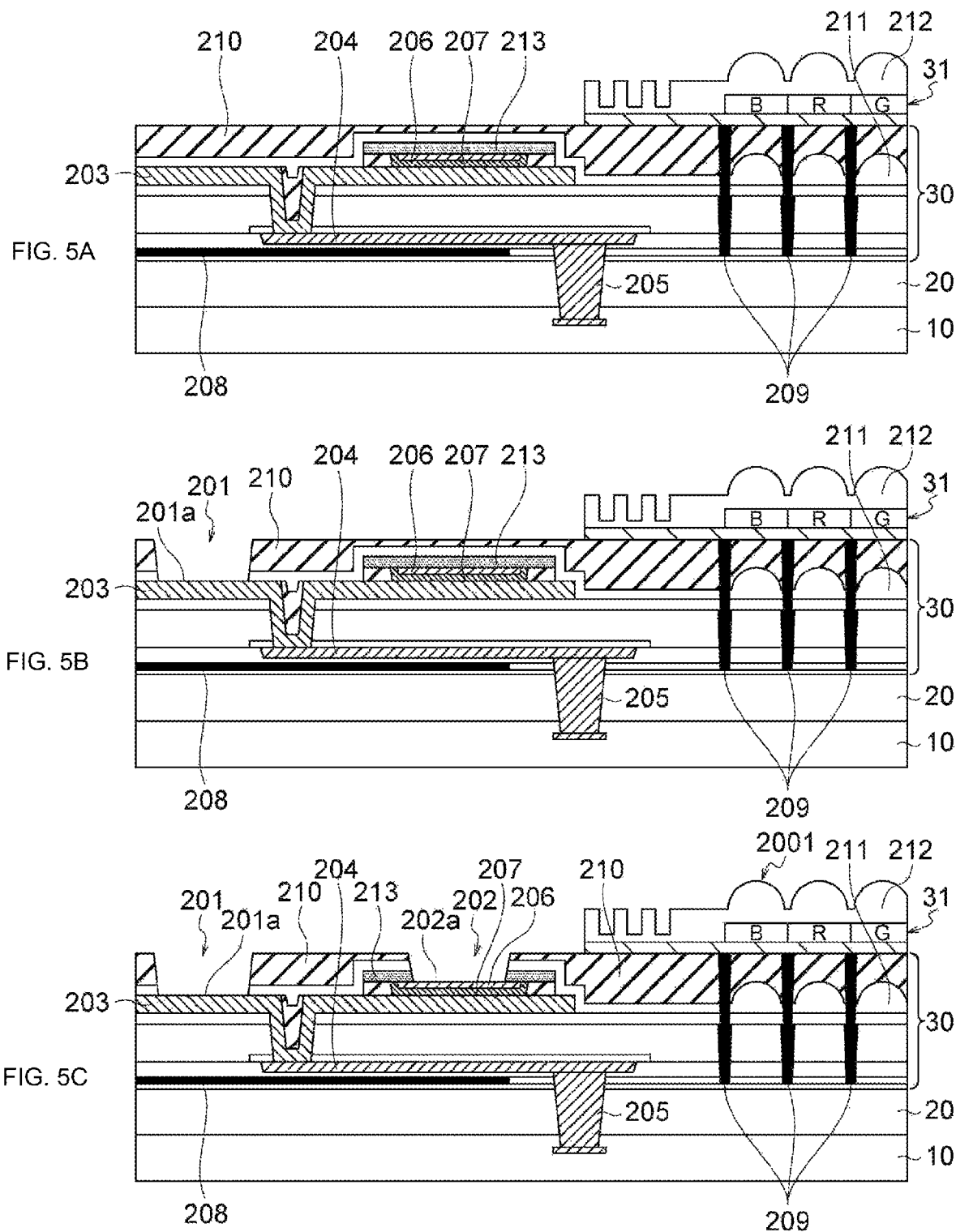

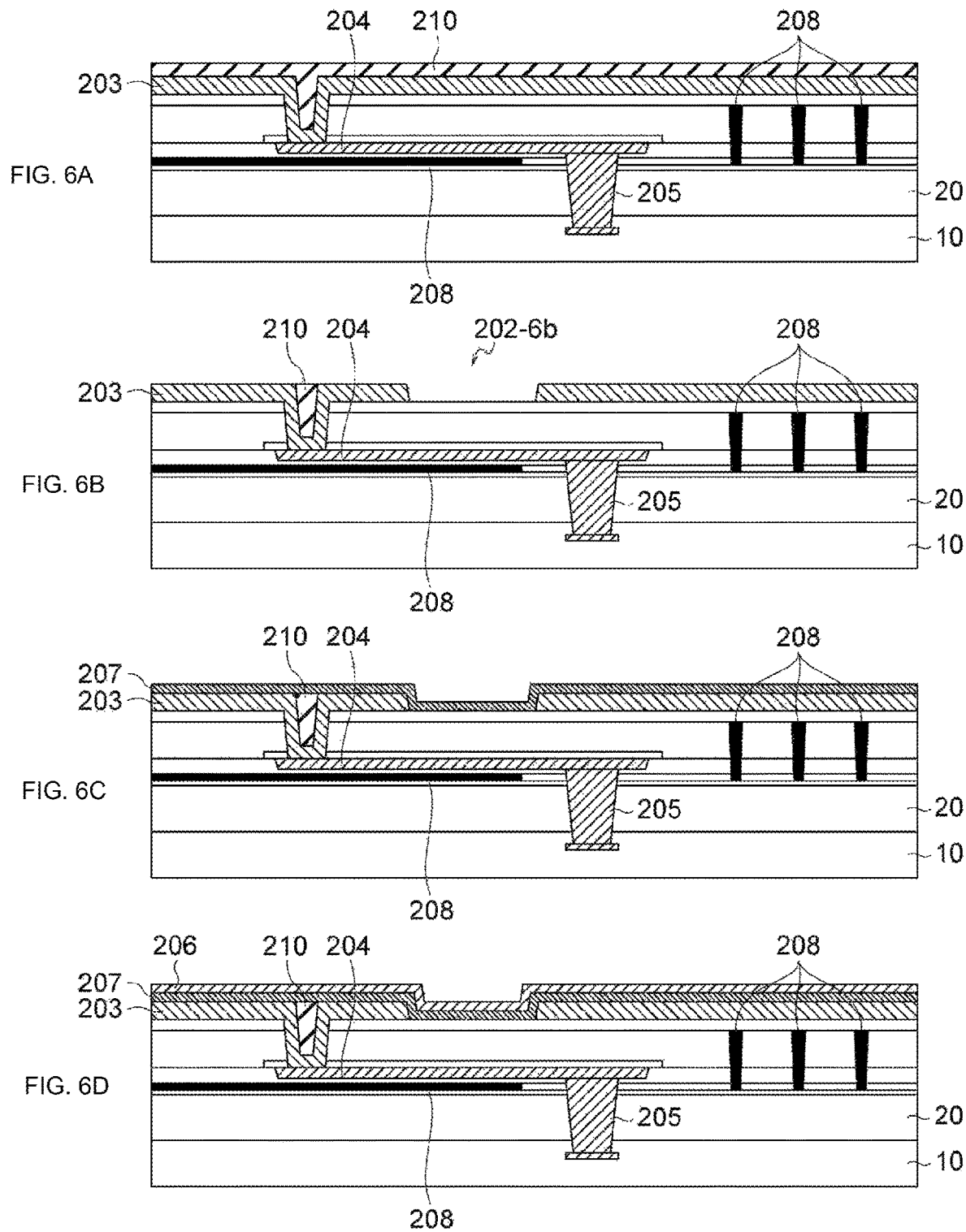

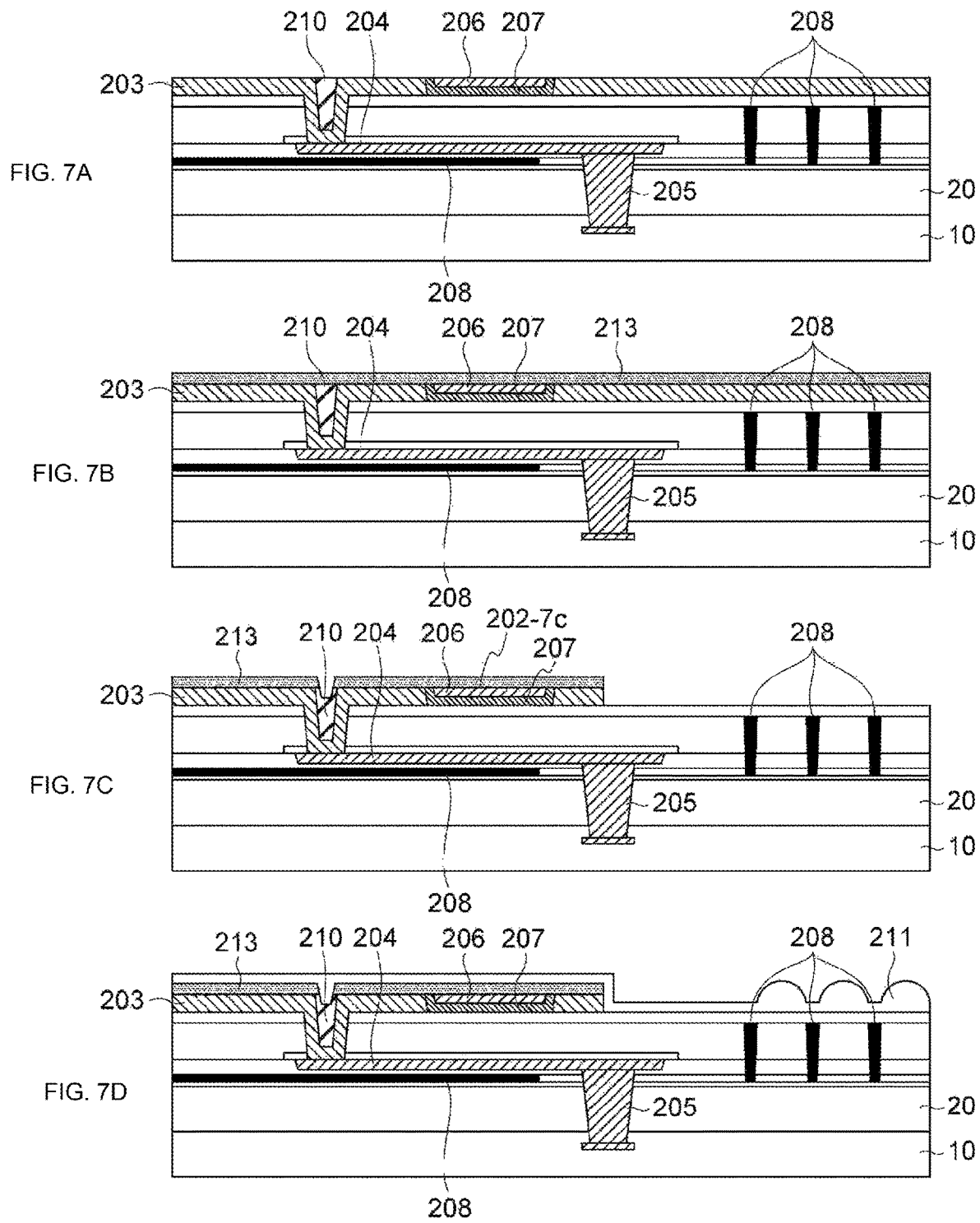

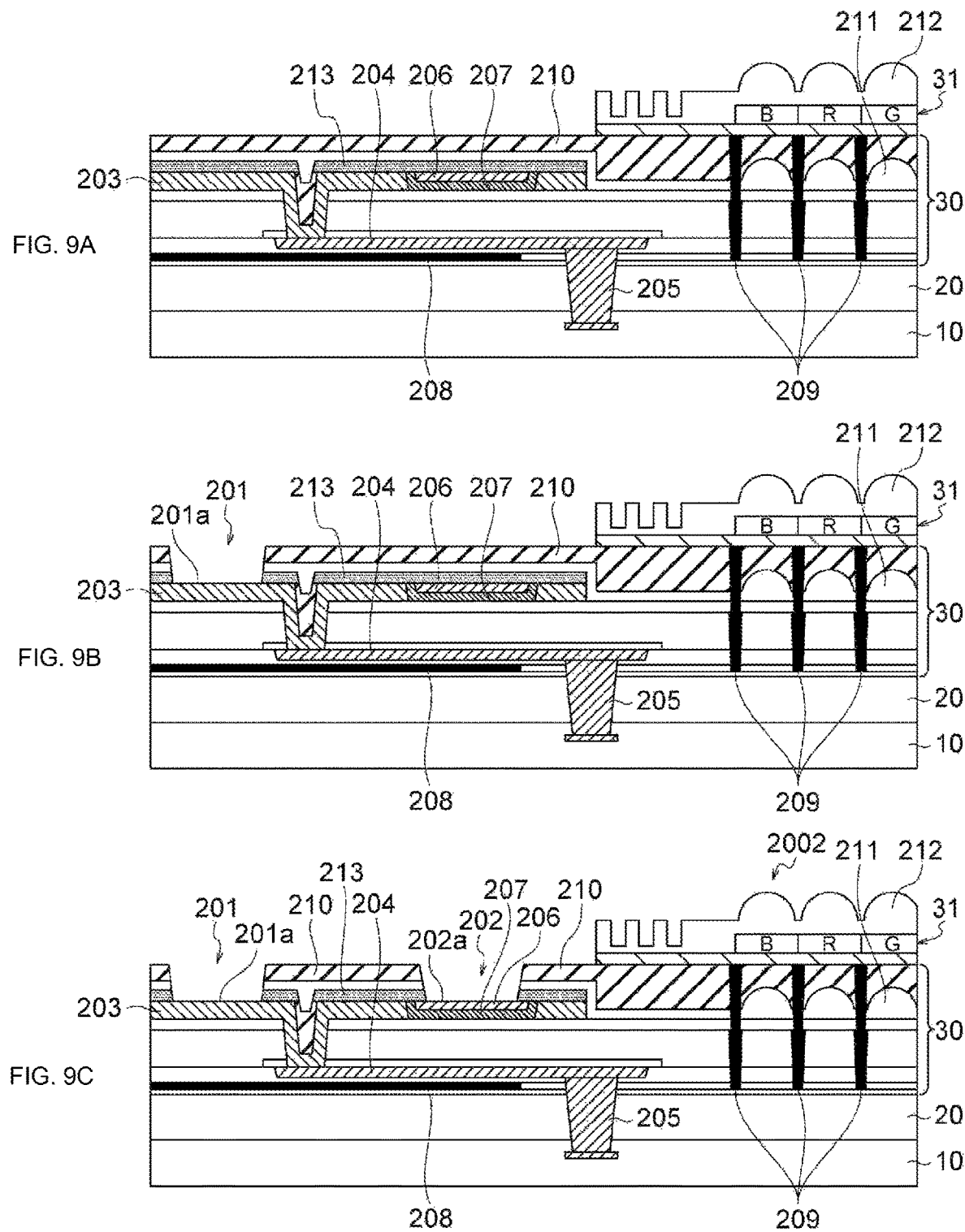

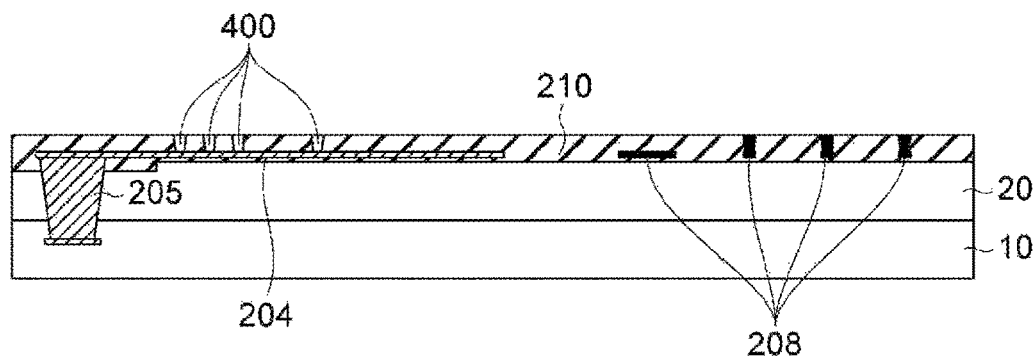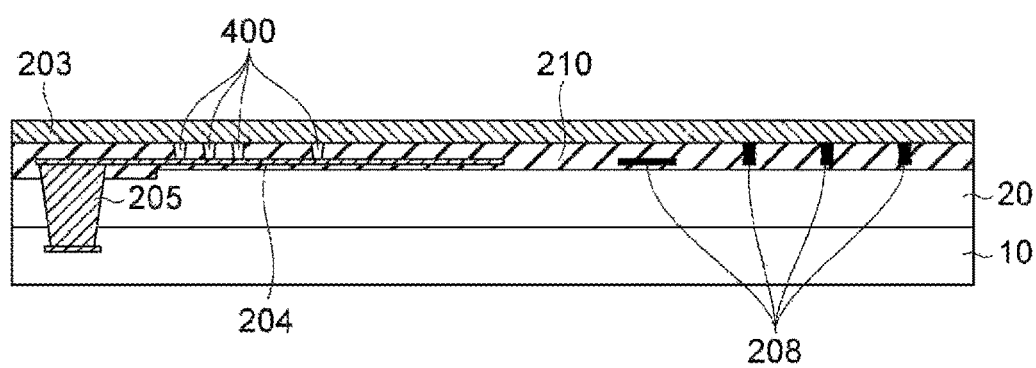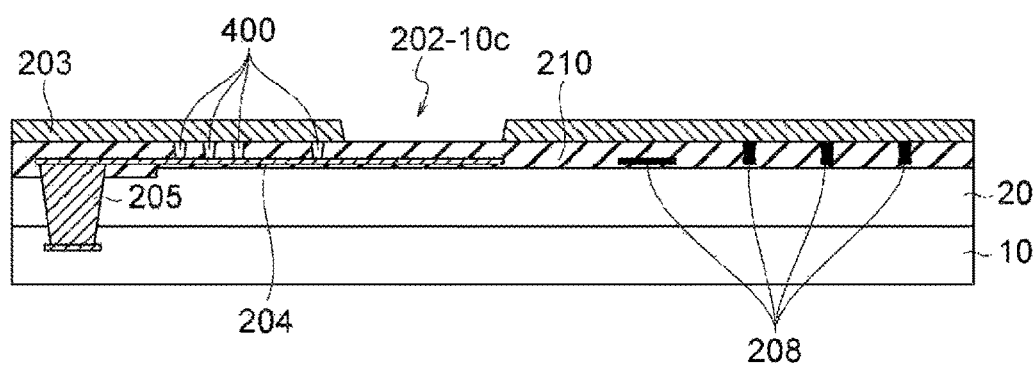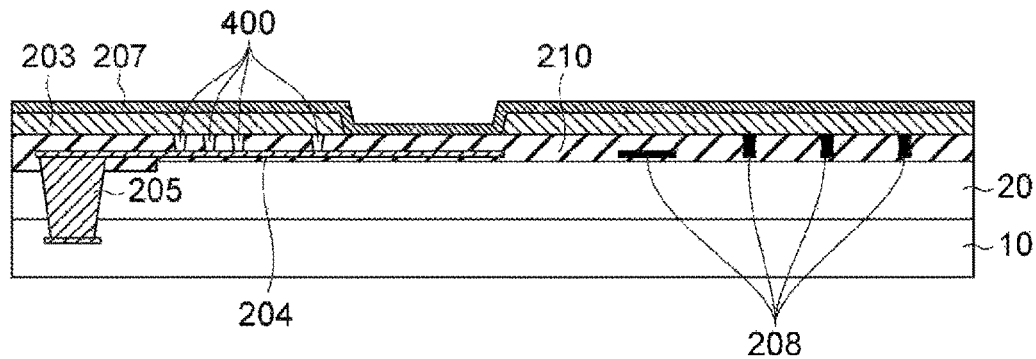

SOLID-STATE IMAGING DEVICE AND ELECTRONIC APPARATUS

CROSS REFERENCE TO RELATED APPLICATIONS

This application is a U.S. National Phase of International Patent Application No. PCT/JP2019/040915 filed on Oct. 17, 2019, which claims priority benefit of Japanese Patent Application No. JP 2018-217455 filed in the Japan Patent Office on Nov. 20, 2018. Each of the above-referenced applications is hereby incorporated herein by reference in its entirety.

TECHNICAL FIELD

The present technology relates to solid-state imaging devices and electronic apparatuses.

BACKGROUND ART

In general, solid-state imaging devices such as complementary metal oxide semiconductor (CMOS) image sensors and charge coupled devices (CCDs) are widely used in digital still cameras, digital video cameras, and the like.

A solid-state imaging device includes a pixel unit that photoelectrically converts incident light, and a peripheral circuit unit that performs signal processing, for example. In such a solid-state imaging device, the pixel unit has a size that is almost fixed depending on the optical system of a product mounted in the solid-state imaging device, while the peripheral circuit unit is scaled down as the process generation advances, leading to a smaller height, a smaller size, and lower costs.

For example, a technology for obtaining a smaller solid-state imaging device in a simpler manner has been suggested (see Patent Document 1).

CITATION LIST

Patent Document

Patent Document 1: Japanese Patent Application Laid-Open No. 2016-171297

SUMMARY OF THE INVENTION

Problems to be Solved by the Invention

By the technology disclosed in Patent Document 1, however, it might not be possible to achieve a further increase in the speed of wiring and a further increase in the density of wiring, while achieving a further decrease in size such as a further decrease in height.

Therefore, the present technology has been made in view of such circumstances, and the principal object thereof is to provide a solid-state imaging device capable of achieving a further decrease in height, a further increase in the speed of wiring, and a further increase in the density of wiring, and an electronic apparatus including the solid-state imaging device.

Solutions to Problems

As a result of intensive studies conducted to achieve the above object, the present inventor has succeeded in further reducing the size such as the height of a solid-state imaging device, further increasing the speed of wiring, and further increasing the density of wiring, and thus, has completed the present technology.

Specifically, the present technology provides a solid-state imaging device that includes: a first semiconductor device including a semiconductor layer in which a photoelectric conversion unit that photoelectrically converts incident light and a penetrating via are provided, a first connecting portion and a second connecting portion on the surface side of the semiconductor layer on the side that receives the light, and a connecting wiring line that connects the first connecting portion, the second connecting portion, and the penetrating via; and a second semiconductor device that is mounted on the first semiconductor device with the first connecting portion. The solid-state imaging device is connected to an external terminal by the second connecting portion.

In the solid-state imaging device according to the present technology, the connecting wiring line may include a first wiring line and a second wiring line, the penetrating via and the second wiring line may be connected to each other via the first wiring line, and the first connecting portion and the second connecting portion may be connected to each other via the second wiring line.

In the solid-state imaging device according to the present technology, the connecting wiring line may include a first wiring line, a second wiring line, and a plurality of contact vias, the penetrating via and the first connecting portion may be connected to each other via the first wiring line, at least one contact via of the plurality of contact vias, and the second wiring line, the penetrating via and the second connecting portion may be connected to each other via the first wiring line, at least one contact via of the plurality of contact vias, and the second wiring line, and the second wiring line may be vertically divided.

In the solid-state imaging device according to the present technology, the connecting wiring line may include a first wiring line, a second wiring line, a plurality of first contact vias, and a plurality of second contact vias, the penetrating via and the first connecting portion may be connected to each other via the first wiring line and at least one first contact via of the plurality of first contact vias, and the penetrating via and the second connecting portion may be connected to each other via the first wiring line, at least one second contact via of the plurality of second contact vias, and the second wiring line.

In the solid-state imaging device according to the present technology, the first connecting portion and the second connecting portion may be disposed in substantially the same layer.

In the solid-state imaging device according to the present technology, the connecting wiring line may include a first wiring line and a second wiring line, the first connecting portion may be buried in a recessed structure included in the second wiring line, and further, the upper surface of the first connecting portion and the upper surface of the second wiring line may be in substantially the same plane.

In the solid-state imaging device according to the present technology, the first connecting portion may have a two-layer structure. In that case, the two-layer structure may include a copper-containing layer and a cobalt-containing layer in order from the light incident side.

In the solid-state imaging device according to the present technology, the second connecting portion may include an aluminum-containing layer.

The present technology also provides an electronic apparatus that includes a solid-state imaging device, the solid-state imaging device including: a first semiconductor device including a semiconductor layer in which a photoelectric conversion unit that photoelectrically converts incident light and a penetrating via are provided, a first connecting portion and a second connecting portion on the surface side of the semiconductor layer on the side that receives the light, and a connecting wiring line that connects the first connecting portion, the second connecting portion, and the penetrating via; and a second semiconductor device that is mounted on the first semiconductor device with the first connecting portion, the solid-state imaging device being connected to an external terminal by the second connecting portion. That is, the present technology provides an electronic apparatus that includes a solid-state imaging device according to the present technology.

Effects of the Invention

According to the present technology, it is possible to achieve a further decrease in size such as a further decrease in height of a solid-state imaging device, a further increase in speed of wiring, and a further increase in density of wiring. Note that effects of the present technology are not limited to the effects described herein, and may include any of the effects described in the present disclosure.

BRIEF DESCRIPTION OF DRAWINGS

FIGS. 1A and 1B are diagrams showing an example configuration of a solid-state imaging device to which the present technology is applied.

FIGS. 2A, 2B, 2C, and 2D are diagrams for explaining a method for manufacturing a solid-state imaging device to which the present technology is applied.

FIGS. 3A, 3B, 3C, and 3D are diagrams for explaining a method for manufacturing a solid-state imaging device to which the present technology is applied.

FIGS. 4A, 4B, and 4C are diagrams for explaining a method for manufacturing a solid-state imaging device to which the present technology is applied.

FIGS. 5A, 5B, and 5C are diagrams for explaining a method for manufacturing a solid-state imaging device to which the present technology is applied.

FIGS. 6A, 6B, 6C, and 6D are diagrams for explaining a method for manufacturing a solid-state imaging device to which the present technology is applied.

FIGS. 7A, 7B, 7C, and 7D are diagrams for explaining a method for manufacturing a solid-state imaging device to which the present technology is applied.

FIGS. 9A, 9B, and 9C are diagrams for explaining a method for manufacturing a solid-state imaging device to which the present technology is applied.

FIGS. 10A, 10B, 10C, and 10D are diagrams for explaining a method for manufacturing a solid-state imaging device to which the present technology is applied.

MODES FOR CARRYING OUT THE INVENTION

Figure 8A:
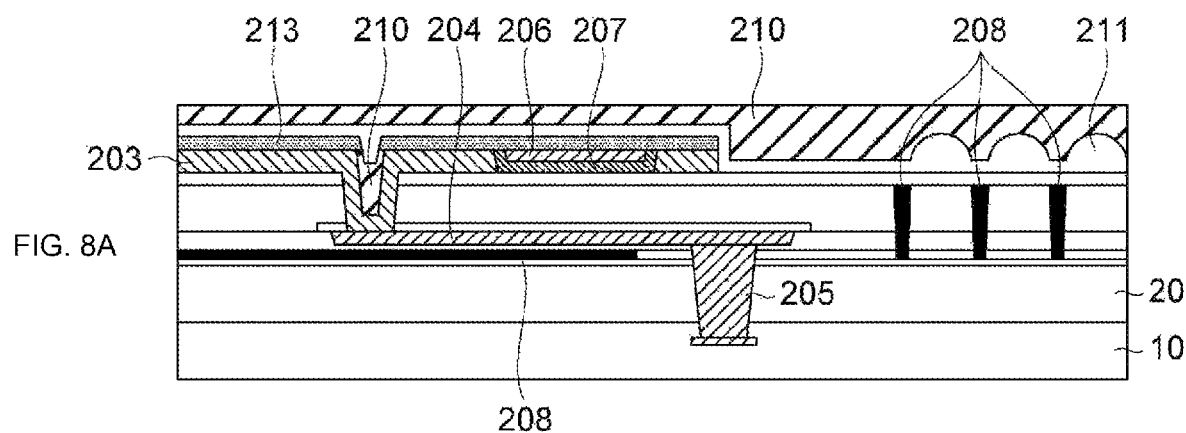
FIGS. 8A, 8B, and 8C are diagrams for explaining a method for manufacturing a solid-state imaging device to which the present technology is applied.

The following is a description of preferred embodiments for carrying out the present technology. The embodiments described below are typical examples of embodiments of the present technology, and do not narrow the interpretation of the scope of the present technology. Note that "upper" means an upward direction or the upper side in the drawings, "lower" means a downward direction or the lower side in the drawings, "left" means a leftward direction or the left side in the drawings, and "right" means a rightward direction or the right side in the drawings, unless otherwise specified. Also, in the drawings, the same or equivalent components or members are denoted by the same reference numerals, and explanation of them will not be repeated.

Explanation will be made in the following order.
1. Outline of the present technology
2. First embodiment (Example 1 of a solid-state imaging device)
3. Second embodiment (Example 2 of a solid-state imaging device)
4. Third embodiment (Example 3 of a solid-state imaging device)
5. Fourth embodiment (Example 4 of a solid-state imaging device)

6. Fifth embodiment (Example 5 of a solid-state imaging device)
7. Sixth embodiment (an example of an electronic apparatus)
8. Examples of use of solid-state imaging devices to which the present technology is applied
9. Example application to an endoscopic surgery system
10. Example applications to mobile structures

1. Outline of the Present Technology

First, the outline of the present technology is described.

In a back-illuminated image sensor, the light receiving unit is formed on the side opposite from the wiring layer surface, and therefore, a thinner sensor chip and a support substrate are indispensable. There is a technology that relates to a structure in which the support substrate is replaced with a logic chip, and a stacked back-illuminated image sensor and a light receiving surface that are electrically connected with the sensor chip and penetrating vias are provided with wiring lines and are stacked.

There is a technology by which a wiring layer is disposed on the light receiving surface with a back-illuminated image sensor so that chip stacking is performed, and the wiring layer of a sensor chip and the wiring layer of the light receiving surface are electrically connected to each other with penetrating vias. By this technology, a connecting portion (a pad (PAD)) for connecting to a stacked chip is formed on the wiring layer formed on the light receiving surface, to enable connection between a sensor chip and the stacked chip.

However, in a structure in which a wiring layer is provided on the light receiving surface before stacking, the connecting portion (pad (PAD)) for electrically connecting to an external device is formed on the wiring layer side. Therefore, it is necessary to extend the connecting portion to the wiring layer side with penetrating vias. At this stage, when high-speed transmission is required, there is a possibility that a delay in signal characteristics will occur due to the penetrating vias. Further, when the wiring distance from the stacked chip is taken into account, wiring line provision or shield formation may not be possible in some cases. In this case, a structure in which the number of wiring layers is increased on the light receiving surface is conceivable. However, in a case where the number of wiring layers is increased, there is a possibility that the light collecting characteristics will be degraded.

The present technology has been developed in view of the above circumstances. A solid-state imaging device according to the present technology is a solid-state imaging device that includes: a first semiconductor device including a semiconductor layer in which a photoelectric conversion unit that photoelectrically converts incident light and a penetrating via are provided, a first connecting portion and a second connecting portion on the light receiving surface side of the semiconductor layer, and a connecting wiring line that connects the first connecting portion, the second connecting portion, and the penetrating via; and a second semiconductor device that is mounted on the first semiconductor device with the first connecting portion. The solid-state imaging device is connected to an external terminal by the second connecting portion. According to the present technology, it is possible to increase the speed of wiring and the density of wiring, while achieving a decrease in size such as a decrease in height. Also, according to the present technology, wiring lines can be easily arranged, and the chip size can be reduced.

A solid-state imaging device according to the present technology may be a back-illuminated solid-state imaging device, and a back-illuminated solid-state imaging device is a solid-state imaging device having a configuration in which a photoelectric conversion element such as a photodiode that receives light from the object is provided between a light receiving surface through which light from the object enters, or an on-chip lens that collects light, and a wiring layer in which the wiring lines of transistors and the like that drive the respective pixels are provided.

In the description below, the overall configuration of a solid-state imaging device according to the present technology is explained with reference to FIG. 21.

Figure 21:
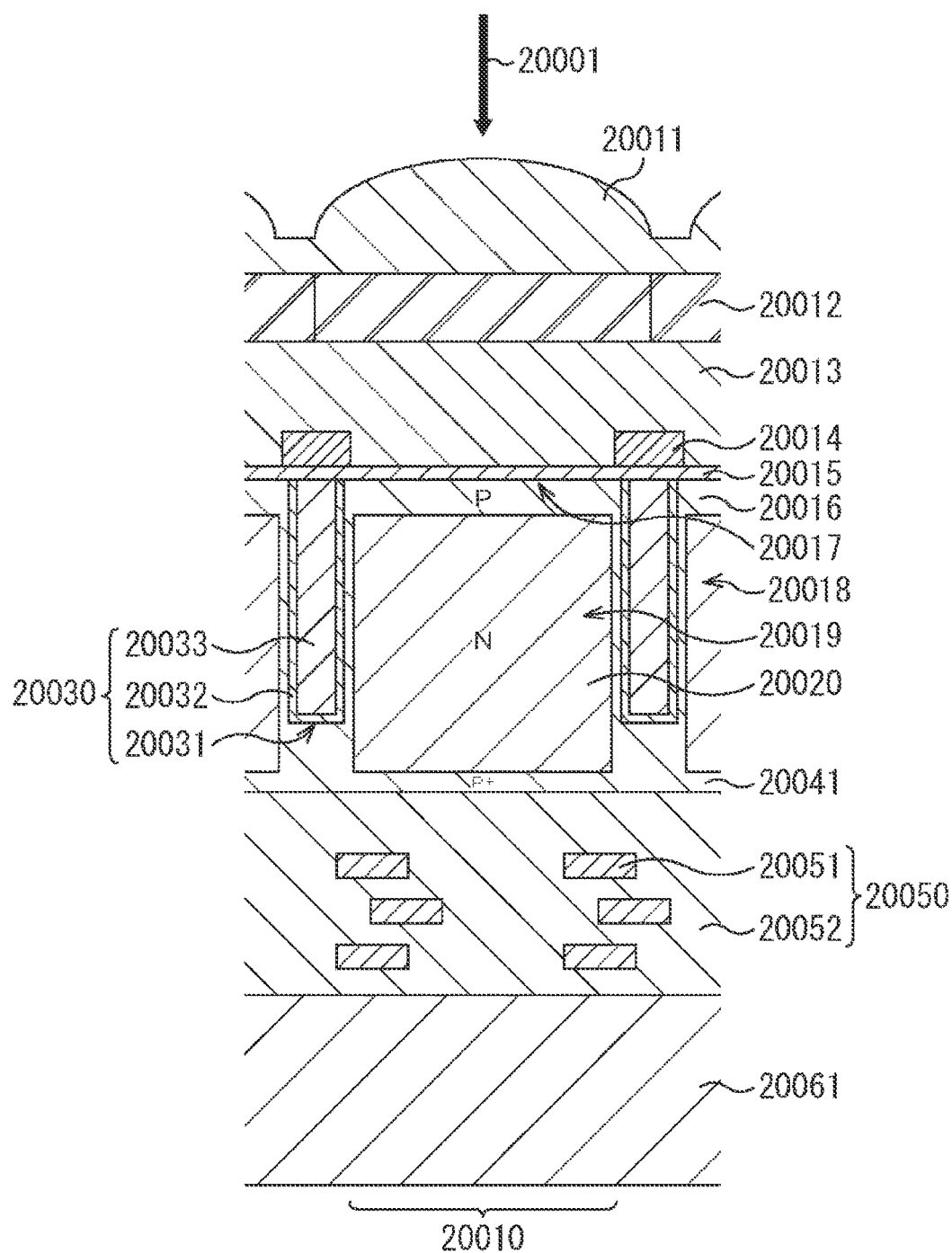
FIG. 21 is a diagram showing an example configuration of an entire solid-state imaging device to which the present technology is applied.

FIG. 21 is a cross-sectional view of an example overall configuration of a solid-state imaging device according to the present technology.

In a solid-state imaging device according to the present technology, a photodiode (PD) 20019 receives incident light 20001 that enters from the back surface (the upper surface in FIG. 21) side of a semiconductor substrate 20018. Above the PD 20019, a planarizing film 20013, a color filter (CF) 20012, and a microlens 20011 are disposed. The incident light 20001 that has entered and sequentially passed through the respective components is received by a light receiving surface 20017, so that photoelectric conversion is performed.

For example, in the PD 20019, an n-type semiconductor region 20020 is formed as a charge storage region that stores electric charges (electrons). In the PD 20019, the n-type semiconductor region 20020 is formed in p-type semiconductor regions 20016 and 20041 of the semiconductor substrate 20018. On a side of the n-type semiconductor region 20020, which is the front surface (the lower surface in FIG. 21) side of the semiconductor substrate 20018, a p-type semiconductor region 20041 having a higher impurity concentration than the back surface (the upper surface in FIG. 21) side is disposed. That is, the PD 20019 has a hole-accumulation diode (HAD) structure, and the p-type semiconductor regions 20016 and 20041 are formed so as to reduce generation of dark current in the respective interfaces with the upper surface side and the lower surface side of the n-type semiconductor region 20020.

In the semiconductor substrate 20018, a pixel separation unit 20030 that electrically separates a plurality of pixels 20010 from one another is provided, and the PD 20019 is disposed in a region partitioned by the pixel separation unit 20030. In a case where the solid-state imaging device is viewed from the upper surface side in the drawing, the pixel separation unit 20030 is formed in a grid-like form so as to be interposed between the plurality of pixels 20010, for example, and the PD 20019 is formed in a region partitioned by this pixel separation unit 20030.

In each PD 20019, the anode is grounded. In the solid-state imaging device, signal charges (electrons, for example) stored by the PD 20019 are read out via a transfer Tr (MOSFET) (not shown) or the like, and are output as an electrical signal to a vertical signal line (VSL) (not shown).

A wiring layer 20050 is provided in the front surface (the lower surface) of the semiconductor substrate 20018 on the opposite side from the back surface (the upper surface) in which the respective components such as a light blocking film 20014, the CF 20012, the microlens 20011, and the like are provided.

The wiring layer 20050 includes wiring lines 20051 and an insulating layer 20052, and is designed so that the wiring lines 20051 are electrically connected to each component in the insulating layer 20052. The wiring layer 20050 is a so-called multilayer wiring layer, and is formed by alternately stacking interlayer insulating films constituting the insulating layer 20052 and the wiring lines 20051 a plurality of times. Here, the respective wiring lines including a wiring line to a Tr for reading out electric charges from the PD 20019, such as a transfer Tr, a VSL, and the like are stacked as the wiring lines 20051 via the insulating layer 20052.

A support substrate 20061 is provided on the surface of the wiring layer 20050 on the opposite side from the side on which the PD 20019 is provided. For example, a substrate including a silicon semiconductor with a thickness of several hundreds of μm is provided as the support substrate 20061.

The light blocking film 20014 is disposed on the back surface (the upper surface in FIG. 21) side of the semiconductor substrate 20018.

The light blocking film 20014 is designed so as to block part of the incident light 20001 traveling from above the semiconductor substrate 20018 toward the back surface of the semiconductor substrate 20018.

The light blocking film 20014 is disposed above the pixel separation unit 20030 formed inside the semiconductor substrate 20018. Here, the light blocking film 20014 is disposed so as to protrude in a convex form from the back surface (the upper surface) of the semiconductor substrate 20018 via an insulating film 20015 such as a silicon oxide film. On the other hand, above the PD 20019 provided inside the semiconductor substrate 20018, the light blocking film 20014 is not disposed, but the portion is left open so that the incident light 20001 can enter the PD 20019.

That is, in a case where the solid-state imaging device is viewed from the upper surface side in the drawing, the planar shape of the light blocking film 20014 is a grid-like shape, and an opening through which the incident light 20001 travels to the light receiving surface 20017 is formed.

The light blocking film 20014 is formed with a light blocking material that blocks light. For example, a titanium (Ti) film and a tungsten (W) film are stacked in this order, to form the light blocking film 20014. Alternatively, a titanium nitride (TiN) film and a tungsten (W) film are stacked in this order, to form the light blocking film 20014, for example.

The light blocking film 20014 is covered with the planarizing film 20013. The planarizing film 20013 is formed with an insulating material that passes light.

The pixel separation unit 20030 includes a groove portion 20031, a fixed charge film 20032, and an insulating film 20033.

The fixed charge film 20032 is formed so as to cover the groove portion 20031 that partitions the plurality of pixels 20010, on the back surface (upper surface) side of the semiconductor substrate 20018.

Specifically, the fixed charge film 20032 is designed to have a constant thickness and cover the inner surface of the groove portion 20031 formed on the back surface (upper surface) side of the semiconductor substrate 20018. The insulating film 20033 is then provided (buried) so as to fill the inside of the groove portion 20031 covered with the fixed charge film 20032.

Here, the fixed charge film 20032 is formed with a high dielectric material having negative fixed charges, so that a positive charge (hole) storage region is formed at the interface with the semiconductor substrate 20018, and generation of dark current is reduced. As the fixed charge film 20032 is formed to have negative fixed charges, an electric field is applied to the interface with the semiconductor substrate 20018 by the negative fixed charges, and thus, a positive charge (hole) storage region is formed.

The fixed charge film 20032 can be formed with a hafnium oxide film ($HfO_2$ film), for example. Alternatively, the fixed charge film 20032 can be formed to include at least one of oxides of hafnium, zirconium, aluminum, tantalum, titanium, magnesium, yttrium, a lanthanoid, or the like, for example.

In the description below, solid-state imaging devices of embodiments according to the present technology will be explained.

2. First Embodiment (Example 1 of a Solid-State Imaging Device)

A solid-state imaging device of a first embodiment (Example 1 of a solid-state imaging device) according to the present technology includes: a first semiconductor device including a semiconductor layer in which a photoelectric conversion unit that photoelectrically converts incident light and a penetrating via are provided, a first connecting portion and a second connecting portion on the light receiving surface side of the semiconductor layer, and a connecting wiring line that connects the first connecting portion, the second connecting portion, and the penetrating via; and a second semiconductor device that is mounted on the first semiconductor device with the first connecting portion. The solid-state imaging device is connected to an external terminal by the second connecting portion, the connecting wiring line includes a first wiring line and a second wiring line, the penetrating via and the second wiring line are connected to each other via the first wiring line, and the first connecting portion and the second connecting portion are connected to each other via the second wiring line.

Figure 16:
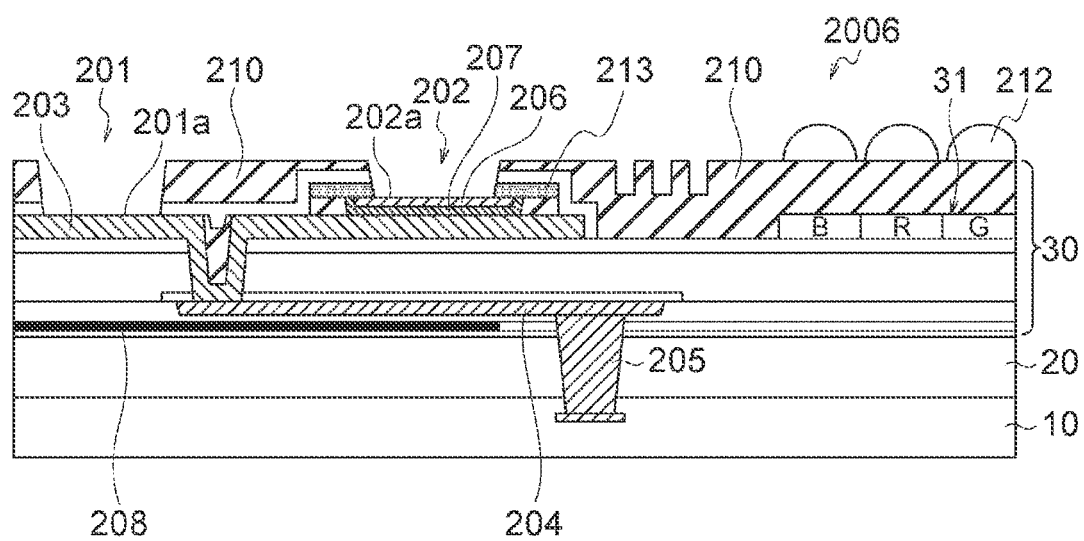
FIG. 16 is a diagram showing an example configuration of a solid-state imaging device to which the present technology is applied.

In the description below, a solid-state imaging device of the first embodiment according to the present technology is explained in greater detail, with reference to FIGS. 1A, 1B, 2A, 2B, 2C, 2D, 3A, 3B, 3C, 3D, 4A, 4B, 4C, 5A, 5B, 5C, and 16. FIGS. 1A 1B and 16 are diagrams showing an example configuration of a solid-state imaging device of the first embodiment according to the present technology. FIG. 1A is a perspective view of a solid-state imaging device 1000. FIG. 1B is a cross-sectional view of a solid-state imaging device 2000 taken along the A-B line shown in FIG. 1A. FIG. 16 is a cross-sectional view of a solid-state imaging device 2006. FIGS. 2A, 2B, 2C, 2D, 3A, 3B, 3C, 3D, 4A, 4B, 4C, 5A, 5B, and 5C are diagrams for explaining a method for manufacturing a solid-state imaging device of the first embodiment according to the present technology.

First, a solid-state imaging device of the first embodiment according to the present technology is described with reference to FIG. 1A.

The solid-state imaging device 1000 shown in FIG. 1A includes a first semiconductor device 1006, second semiconductor devices 1001 and 1003, and a support substrate 1004. The first semiconductor device 1006 is a sensor semiconductor device. The second semiconductor device 1001 is a logic semiconductor device including a logic circuit that performs signal processing, a memory semiconductor device that functions as a memory including a memory circuit, or the like, for example. Likewise, the second semiconductor device 1003 is a logic semiconductor device including a logic circuit that performs signal processing, a memory semiconductor device that functions as a memory including a memory circuit, or the like. Further, the support substrate 1004 may be a logic semiconductor device or a memory semiconductor device, instead of a support substrate.

The first semiconductor device 1006 includes an effective pixel region 1002 and peripheral regions 1007 and 1008. A plurality of pixels is arranged in a matrix in the effective pixel region 1002, and each pixel is formed with a pixel circuit that includes a photoelectric conversion element (a photodiode (PD), for example) that receives light from the object and performs photoelectric conversion, a charge storage portion that stores electric charges obtained by the photoelectric conversion, and a plurality of field effect transistors, for example.

With first connecting portions (bump pads (Bump Pads)) 1005 or the like, the second semiconductor device 1001 is mounted in the direction indicated by an arrow in a peripheral region 1007 that is a region other than the effective pixel region 1002 in the first semiconductor device 1006. Likewise, with a plurality of first connecting portions (bump pads), the second semiconductor device 1003 is mounted in the direction indicated by an arrow in a peripheral region 1008 that is a region other than the effective pixel region 1002 in the first semiconductor device 1006. That is, the solid-state imaging device 1000 is a stacked solid-state imaging device in which the second semiconductor devices 1001 and 1003 are mounted (flip-chip mounted, for example) on the first semiconductor device 1006.

Second connecting portions (wire bonding pads (WB PADs)) are not shown in FIG. 1A, but a plurality of second connecting portions is provided at each of the two ends (the end on the left side (the left side in FIG. 1A) of the peripheral region 1007 and the end on the right side (the right side in FIG. 1A) of the peripheral region 1008) of the first semiconductor device.

Referring now to FIG. 1B, a solid-state imaging device of the first embodiment according to the present technology is described. As described above, FIG. 1B is a cross-sectional view of the solid-state imaging device 2000 taken along the A-B line shown in FIG. 1A. The left side (the left side in FIG. 1B) of the solid-state imaging device 2000 corresponds to a peripheral region of the first semiconductor device (sensor semiconductor device), and the right side (the right side in FIG. 1B) of the solid-state imaging device 2000 corresponds to the effective pixel region of the first semiconductor device (sensor semiconductor device).

The solid-state imaging device 2000 includes a first wiring layer 30, a semiconductor layer 20 that is a silicon substrate, and a second wiring layer 10 in this order from the light incident side (the light receiving surface side) (the upper side in FIG. 1B).

A first connecting portion 202a, a second connecting portion 201b, a first wiring line 204, and a second wiring line 203 are formed in the first wiring layer 30 disposed on the surface side of the semiconductor layer 20 on the light receiving side. A penetrating via 205 penetrates the first wiring layer 30, the semiconductor layer 20, and the second wiring layer 10. The upper end of the penetrating via 205 formed in the first wiring layer is connected to the first wiring line 204, and the lower end of the penetrating via 205 formed in the second wiring layer 10 is connected to a wiring line formed in the second wiring layer. The first wiring line 204 and the second wiring line 203 are connected, the second wiring line 203 is continuously formed from the first connecting portion 202a to the second connecting portion 201a, and the first connecting portion 202a and the second connecting portion 201a are connected via the second wiring line 203. Note that, as the connecting wiring lines that connect the first connecting portion 202a, the second connecting portion 201a, and the penetrating via 205, the first wiring line 204 and the second wiring line 203 are formed in FIG. 1B. However, the connecting wiring lines may be formed with one wiring line, or may be formed with three or more wiring lines.

The first wiring line 204 may include any metal material. However, the first wiring line 204 may include copper (Cu), aluminum (Al), or the like, for example, and preferably includes copper (Cu). The second wiring line 203 may include any metal. However, the second wiring line 203 may include copper (Cu), aluminum (Al), or the like, for example, and preferably includes aluminum (Al).

The first connecting portion 202a is a portion of a two-layer stack structure corresponding to an opening 202 of a two-layer stack structure in which a second layer 206 is stacked on a first layer 207, and is a bump pad (Bump PAD). With the first connecting portion 202a, the first semiconductor device (sensor semiconductor device) 1006 and the second semiconductor device (a logic semiconductor device, for example) are connected, and the second semiconductor device (a logic semiconductor device, for example) 1001 is flip-chip mounted in the peripheral region 1007 on the light receiving surface side of the first semiconductor device (sensor semiconductor device) 1006.

The first layer 207 may contain any metal material. However, the first layer 207 may contain cobalt (Co), copper (Cu), tantalum (Ta), or tantalum nitride (TaN), for example, and preferably contains cobalt (Co). The second layer 206 may contain any metal material. However, the second layer 206 may contain copper (Cu), cobalt (Co), tantalum (Ta), or tantalum nitride (TaN), for example, and preferably contains copper (Cu). In the two-layer stack structure, the region other than the region corresponding to the opening 202 is covered with a stack in which an oxide film 213, a lens material 211d, and an antireflective film (a coating material) 211c are stacked in this order. Note that the first connecting portion 202a may be a portion of a two-layer stack structure corresponding to the opening, but may also be a portion of a single-layer structure corresponding to the opening, or a portion of a stack structure that is formed with three or more layers and corresponds to the opening.

The second connecting portion 201a is a portion of the second wiring line corresponding to an opening 201 in the second wiring line 203, and is a wire bonding pad (WB PAD). Accordingly, the second connecting portion 201a includes the same metal material as the metal material of the second wiring line 203. The second connecting portion 201a is connected to an external terminal (not shown) by wire bonding. Note that the second connecting portion 201a may be a portion of the second wiring line corresponding to the opening, but may also be a portion that is formed with a member independent of the second wiring line and corresponds to the opening, or a portion that includes a different material from the second wiring line and corresponds to the opening.

As shown in FIG. 1B, the solid-state imaging device 2000 includes, for each pixel, at least: an on-chip lens 212 that gathers light entering from the object; a color filter 31 (a blue-light color filter, a red-light color filter, or a green-light color filter), an insulating film 210, an inner lens 211b coated with an antireflective film 211a, and a photodiode (PD) (not shown) formed in the semiconductor layer 20, in this order from the light receiving side (the light incident side, which is the upper side in FIG. 1B).

The solid-state imaging device 2000 also includes light blocking walls 209 (including a tungsten (W) material, for example) for light blocking between pixels, and a shield metal (including a tungsten (W) material, for example) that blocks out noise and light and is formed in the first wiring layer.

Next, a method for manufacturing a solid-state imaging device 2001 of the first embodiment according to the present technology is described with reference to FIGS. 2A, 2B, 2C, 2D, 3A, 3B, 3C, 3D, 4A, 4B, 4C, 5A, 5B, and 5C.

As shown in FIG. 2A, after the first wiring line 204 is formed, light blocking films (shield metals) 208 in the effective pixel region (the right side in FIG. 2A) are formed, and the second wiring line 203 and the insulating film 210 are formed. Note that, specifically, the structure shown in FIG. 2A can be manufactured by a conventional method, or according to the contents disclosed in Patent Document 2016-171297, for example.

Next, the insulating film 210 is processed by a photoresist process and a forming process such as dry etching, so that an opening 202-2b for a bump pad (Bump PAD) corresponding to the first connecting portion 202a is formed (FIG. 2B). After that, a Ti/TiN/Co film is formed by sputtering, so that a cobalt-containing layer 207 is formed (FIG. 2C). Ti/TiN is a barrier metal layer, and Ti/TiN is preferably formed because of its manufacturing suitability. Note that a single Co film may be formed to obtain a layer 207 including cobalt. Next, a copper (Cu) film is formed by sputtering, so that a copper-containing layer 206 is formed (FIG. 2D).

After that, planarization (polishing) is performed by chemical mechanical polishing (CMP) (FIG. 3A), followed by formation of the oxide film 213 (FIG. 3B).

The corresponding portion 202-3c of the bump pad (Bump PAD) corresponding to the first connecting portion 202a is processed (FIG. 3C), and inner lenses 211 are formed (FIG. 3D). After the insulating film 210 is formed, and planarization (polishing) is performed by chemical mechanical polishing (CMP) (FIG. 4A), light blocking portions for forming light blocking walls 209 are formed with a photoresist and by dry etching, and tungsten (W) films or the like are formed, so that the light blocking walls 209 are formed (FIG. 4B). After that, the color filters (a blue-light color filter, a red-light color filter, and a green-light color filter, for example) 31 and the on-chip lenses (OCLs) 212 are formed (FIGS. 4D and 5A). The opening 201 for the second connecting portion (a wire bonding pad (WB PAD)) is formed, and the second connecting portion 201a is formed (FIG. 5B). Lastly, the opening 202 for the first connecting portion (bump pad (Bump PAD)) is formed, and the first connecting portion 202a is formed. Thus, the solid-state imaging device 2001 is manufactured (FIG. 5C).

Next, a solid-state imaging device of the first embodiment according to the present technology is described with reference to FIG. 16.

As shown in FIG. 16, a solid-state imaging device 2006 is a solid-state imaging device that has substantially the same structure as the solid-state imaging device 2001, except for not including the light blocking walls 209 included in the solid-state imaging device 2001. Therefore, detailed explanation of the structure of the solid-state imaging device 2006 is not made herein.

3. Second Embodiment (Example 2 of a Solid-State Imaging Device)

A solid-state imaging device of a second embodiment (Example 2 of a solid-state imaging device) according to the present technology includes: a first semiconductor device including a semiconductor layer in which a photoelectric conversion unit that photoelectrically converts incident light and a penetrating via are provided, a first connecting portion and a second connecting portion on the light receiving surface side of the semiconductor layer, and a connecting wiring line that connects the first connecting portion, the second connecting portion, and the penetrating via; and a second semiconductor device that is mounted on the first semiconductor device with the first connecting portion. The solid-state imaging device is connected to an external terminal by the second connecting portion, and the first connecting portion and the second connecting portion are disposed in substantially the same layer.

Figure 17:
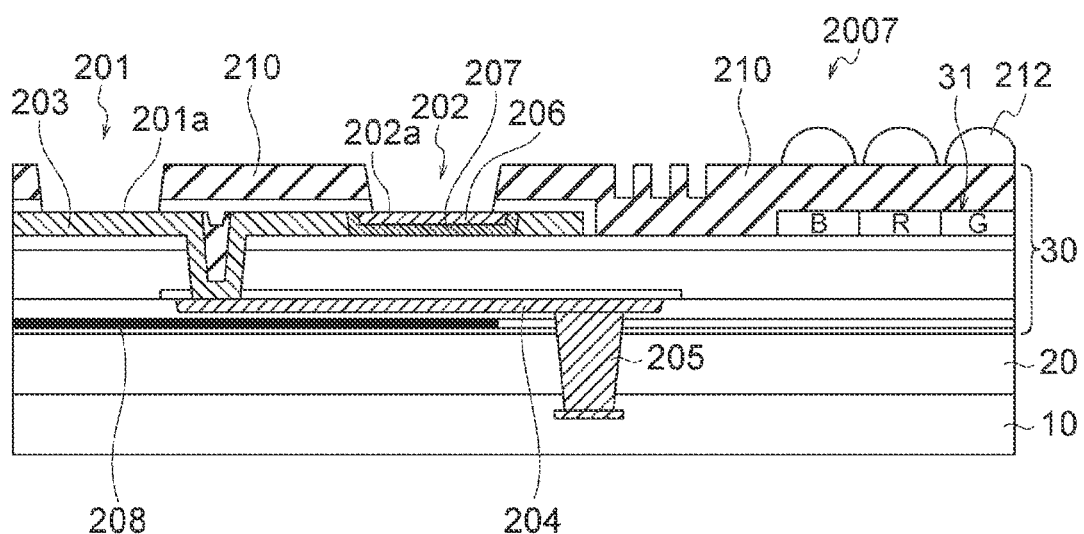
FIG. 17 is a diagram showing an example configuration of a solid-state imaging device to which the present technology is applied.

In the description below, a solid-state imaging device of the second embodiment according to the present technology is explained in greater detail, with reference to FIGS. 6A, 6B, 6C, 6D, 7A, 7B, 7C, 7D, 8A, 8B, 8C, 9A, 9B, 9C, and 17. FIGS. 6A, 6B, 6C, 6D, 7A, 7B, 7C, 7D, 8A, 8B, 8C, 9A, 9B, and 9C are diagrams for explaining a method for manufacturing a solid-state imaging device of the second embodiment according to the present technology. FIG. 17 is a diagram showing an example configuration of a solid-state imaging device of the second embodiment according to the present technology, and is a cross-sectional view of a solid-state imaging device 2007.

Referring now to FIGS. 6A, 6B, 6C. 6D, 7A, 7B, 7C, 7D, 8A, 8B, 8C, 9A, 9B, and 9C, a method for manufacturing a solid-state imaging device 2002 of the second embodiment according to the present technology is described.

As shown in FIG. 6A, after a first wiring line 204 is formed, light blocking films (shield metals) 208 are formed in the effective pixel region (the right side in FIG. 6A), and a second wiring line 203 and an insulating film 210 are formed. Note that, specifically, the structure shown in FIG. 6A can be manufactured by a conventional method, or according to the contents disclosed in Patent Document 2016-171297, for example.

Next, the second wiring line 203 and the insulating film 210 are processed by a photoresist process and a forming process such as dry etching, so that an opening 202-6b for a bump pad (Bump PAD) corresponding to a first connecting portion 202a is formed (FIG. 6B). The upper portion of the opening 202-6b and the upper portion of the second wiring line 203 are substantially in the same plane. That is, the height of the opening 202-6b and the height of the second wiring line 203 are substantially the same.

After that, a Ti/TiN/Co film is formed by sputtering, so that a cobalt-containing layer 207 is formed (FIG. 6C). Ti/TiN is a barrier metal layer, and Ti/TiN is preferably formed because of its manufacturing suitability. Note that a single Co film may be formed to obtain a layer 207 including cobalt. Next, a copper (Cu) film is formed by sputtering, so that a copper-containing layer 206 is formed (FIG. 6D).

After that, planarization (polishing) is performed by chemical mechanical polishing (CMP) (FIG. 7A). Next, an oxide film 213 is formed (FIG. 7B).

Figure 8B:
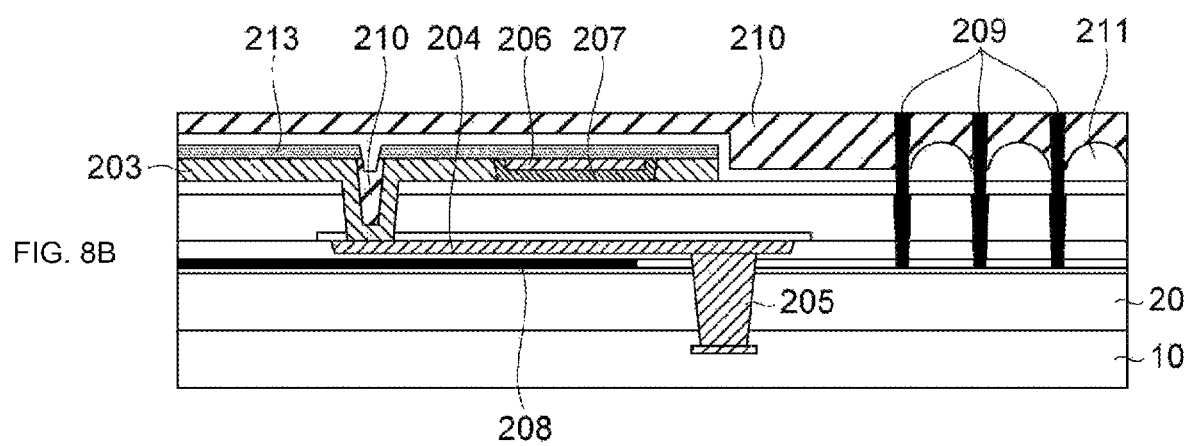
Figure 8C:
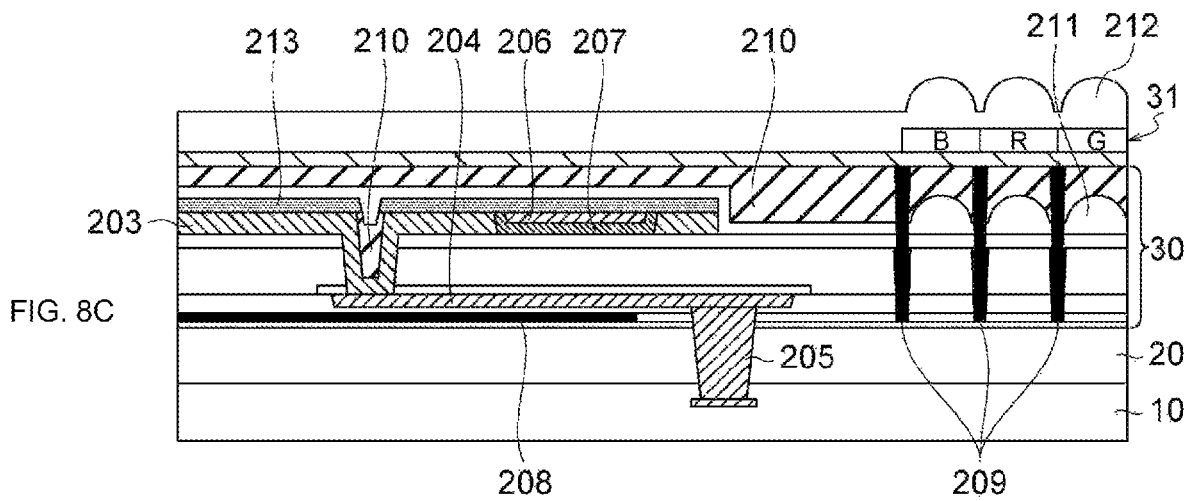

The portion of the second wiring line 203 on the right side (the right side in FIG. 7C) of a bump pad (Bump PAD) portion 202-7c corresponding to the first connecting portion 202a is processed and removed (FIG. 7C), and inner lenses 211 are formed (FIG. 7D). After the insulating film 210 is formed, and planarization (polishing) is performed by chemical mechanical polishing (CMP) (FIG. 8A), light blocking portions for forming light blocking walls 209 are formed with a photoresist and by dry etching, and tungsten (W) films or the like are formed, so that the light blocking walls 209 are formed (FIG. 8B). After that, color filters (a blue-light color filter, a red-light color filter, and a green-light color filter, for example) 31 and on-chip lenses (OCLs)

212 are formed (FIGS. 8D and 9A). The opening 201 for the second connecting portion (wire bonding pad (WB PAD)) is formed, so that the second connecting portion 201a (wire bonding pad (WB PAD)) is formed (FIG. 9B). Lastly, the opening 202 for the first connecting portion (bump pad (Bump PAD)) is formed, and the first connecting portion 202a (bump pad (Bump PAD)) is formed. Thus, the solid-state imaging device 2002 is manufactured (FIG. 9C).

As shown in FIG. 9C, in the solid-state imaging device 2002, the first connecting portion 202a and the second connecting portion 201a are disposed in substantially the same layer, so that degradation of pixel characteristics due to uneven sweeping that might occur at the time of the formation of the on-chip lenses (OCLs) 212 can be prevented. The first connecting portion 202a and the second connecting portion 201a being disposed in substantially the same layer is now described in greater detail. The first connecting portion 202a and the second connecting portion 201a are formed in the second wiring line 203, and accordingly, are formed in substantially the same layer. More specifically, the upper surface (connecting surface) (the upper side in FIG. 9C) of the first connecting portion 202a and the upper surface (connecting surface) (the upper side in FIG. 9C) of the second connecting portion 201a are disposed substantially in the same plane, and the lower surface (the lower side in FIG. 9C) of the first connecting portion 202a and the lower surface (the lower side in FIG. 9C) of the second connecting portion 201a are disposed in substantially the same plane.

Next, a solid-state imaging device of the second embodiment according to the present technology is described with reference to FIG. 17.

As shown in FIG. 17, a solid-state imaging device 2007 is a solid-state imaging device that has substantially the same structure as the solid-state imaging device 2002, except for not including the light blocking walls 209 included in the solid-state imaging device 2002. Therefore, detailed explanation of the structure of the solid-state imaging device 2007 is not made herein.

In addition to the contents described above, the contents explained in the description of the solid-state imaging devices of the first embodiment according to the present technology can be applied, without any change, to the solid-state imaging devices of the second embodiment according to the present technology, unless there is some technical contradiction.

4. Third Embodiment (Example 3 of a Solid-State Imaging Device)

A solid-state imaging device of a third embodiment (Example 3 of a solid-state imaging device) according to the present technology includes: a first semiconductor device including a semiconductor layer in which a photoelectric conversion unit that photoelectrically converts incident light and a penetrating via are provided, a first connecting portion and a second connecting portion on the light receiving surface side of the semiconductor layer, and a connecting wiring line that connects the first connecting portion, the second connecting portion, and the penetrating via; and a second semiconductor device that is mounted on the first semiconductor device with the first connecting portion. The solid-state imaging device is connected to an external terminal by the second connecting portion, the connecting wiring line includes a first wiring line, a second wiring line, and a plurality of contact vias, the penetrating via and the first connecting portion are connected to each other via the first wiring line, at least one of the plurality of contact vias, and the second wiring line, and the penetrating via and the second connecting portion are connected to each other via the first wiring line, at least one of the plurality of contact vias, and the second wiring line. In the solid-state imaging device of the third embodiment according to the present technology, the second wiring line may be divided in the vertical direction.

Figure 18:
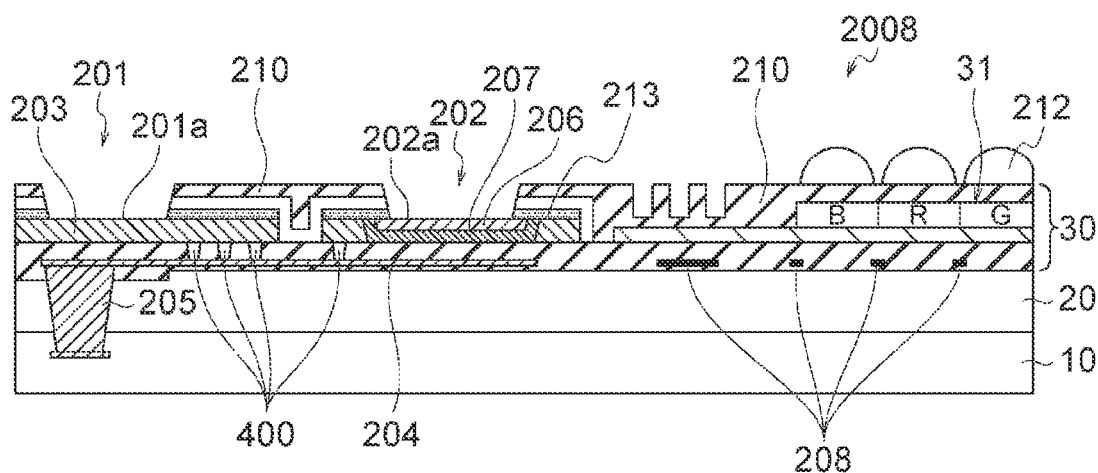
FIG. 18 is a diagram showing an example configuration of a solid-state imaging device to which the present technology is applied.

In the description below, a solid-state imaging device of the third embodiment according to the present technology is explained in greater detail, with reference to FIGS. 10A, 10B, 10C, 10D, 11A, 11B, 11C, 11D, 12A, 12B, 12C, 13A, 13B, 13C, and 18. FIGS. 10A, 10B, 10C, 10D, 11A, 11B, 11C, 11D, 12A, 12B, 12C, 13A, 13B, and 13C are diagrams for explaining a method for manufacturing a solid-state imaging device of the third embodiment according to the present technology. FIG. 18 is a diagram showing an example configuration of a solid-state imaging device of the third embodiment according to the present technology, and is a cross-sectional view of a solid-state imaging device 2008.

Referring now to FIGS. 10A, 10B, 10C, 10D, 11A, 11B, 11C, 11D, 12A, 12B, 12C, 13A, 13B, and 13C, a method for manufacturing a solid-state imaging device 2003 of the third embodiment according to the present technology is described.

As shown in FIG. 10A, after a first wiring line 204 is formed, light blocking films (shield metals) 208 are formed in the effective pixel region (the right side in FIG. 10A), contact vias 400 are formed in a pixel peripheral portion (the left side in FIG. 10A), and an insulating film 210 is formed. A second wiring line 203 (aluminum) is then formed on the insulating film 210. Note that, specifically, the structure shown in FIG. 10A can be manufactured by a conventional method, or according to the contents disclosed in Patent Document 2016-171297, for example.

Next, the second wiring line 203 and the insulating film 210 are processed by a photoresist process and a forming process such as dry etching, so that an opening 202-10c corresponding to a first connecting portion (bump pad (Bump PAD)) 202a is formed (FIG. 10C). The upper portion of the opening 202-10c and the upper portion of the second wiring line 203 are substantially in the same plane. That is, the height of the opening 202-10c and the height of the second wiring line 203 are substantially the same.

Figure 11A:
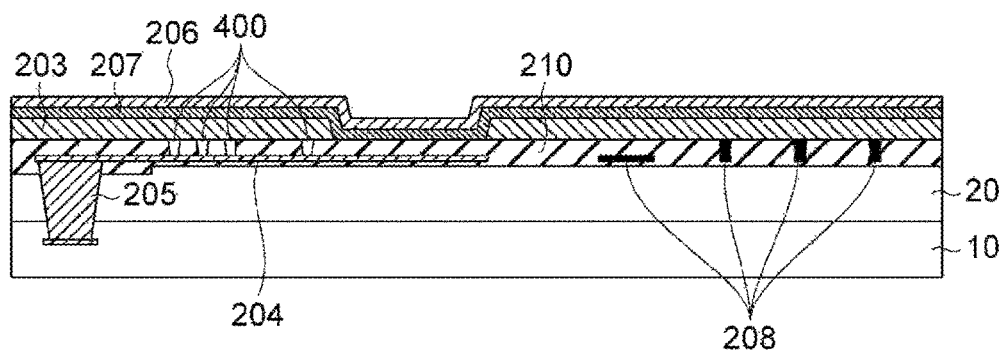
FIGS. 11A, 11B, 11C, and 11D are diagrams for explaining a method for manufacturing a solid-state imaging device to which the present technology is applied.

After that, a Ti/TiN/Co film is formed by sputtering, so that a cobalt-containing layer 207 is formed (FIG. 10D). Ti/TiN is a barrier metal layer, and Ti/TiN is preferably formed because of its manufacturing suitability. Note that a single Co film may be formed to obtain a layer 207 including cobalt. Next, a copper (Cu) film is formed by sputtering, so that a copper-containing layer 206 is formed (FIG. 11A).

Figure 11B:
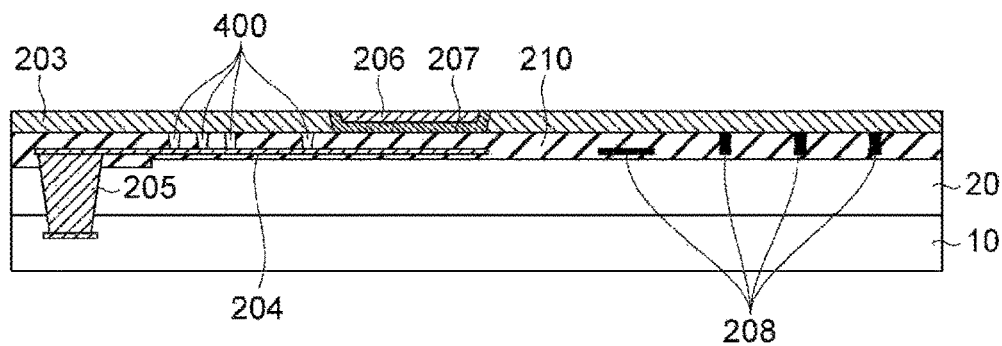
Figure 11C:
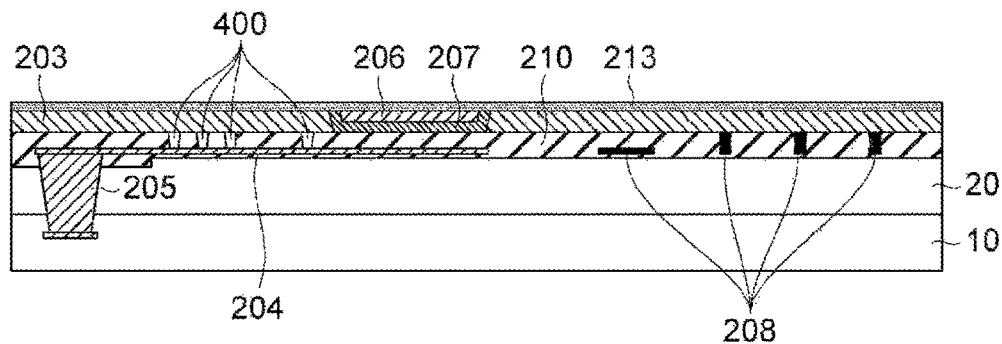
Figure 11D:
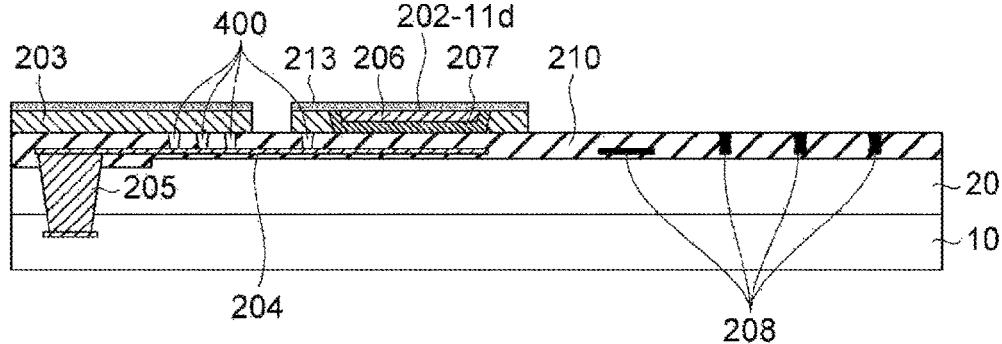

After that, planarization (polishing) is performed by chemical mechanical polishing (CMP) (FIG. 11B). Next, an oxide film 213 is formed (FIG. 11C).

The second wiring line 203 and the oxide film 213 are processed and are then removed on the right side (the right side in FIG. 11D) of a bump pad (Bump PAD) portion 202-11d corresponding to the first connecting portion 202a. Further, the second wiring line 203 and the oxide film 213 are processed and are then removed (FIG. 11D) so that the second wiring line 203 and the oxide film 213 are divided between the first one and the second one of the contact vias 400 counted from the right side (the right side in FIG. 11D).

Figure 12A:
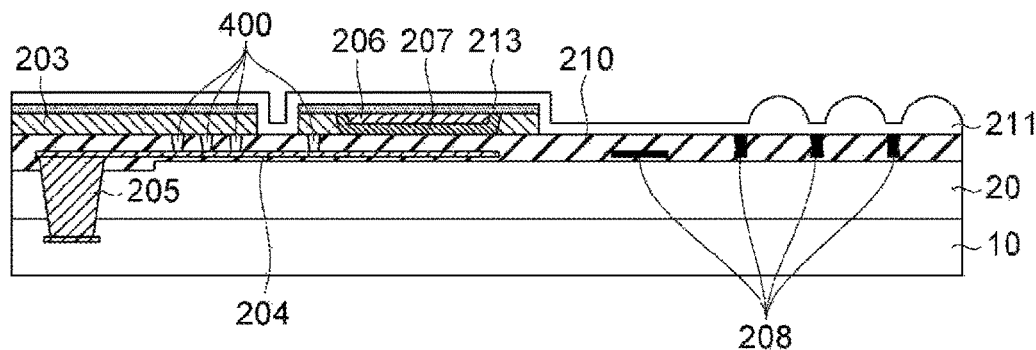
FIGS. 12A, 12B, and 12C are diagrams for explaining a method for manufacturing a solid-state imaging device to which the present technology is applied.
Figure 12B:
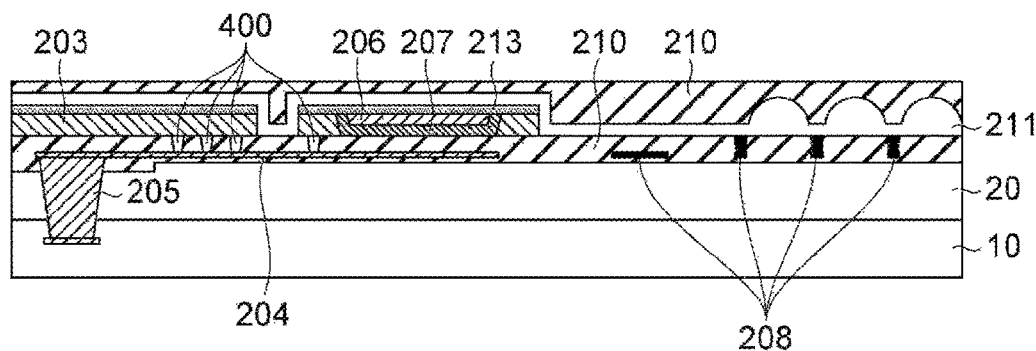

Inner lenses 211 are then formed (FIG. 12A). After the insulating film 210 is formed, and planarization (polishing) is performed by chemical mechanical polishing (CMP)

Figure 12C:
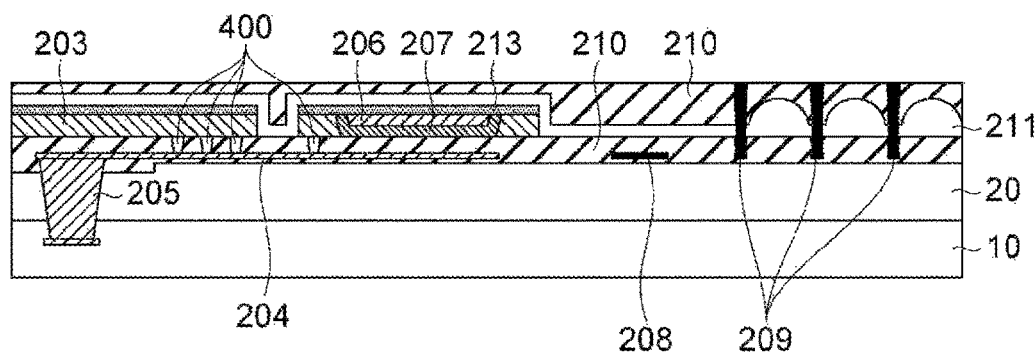
Figure 13A:
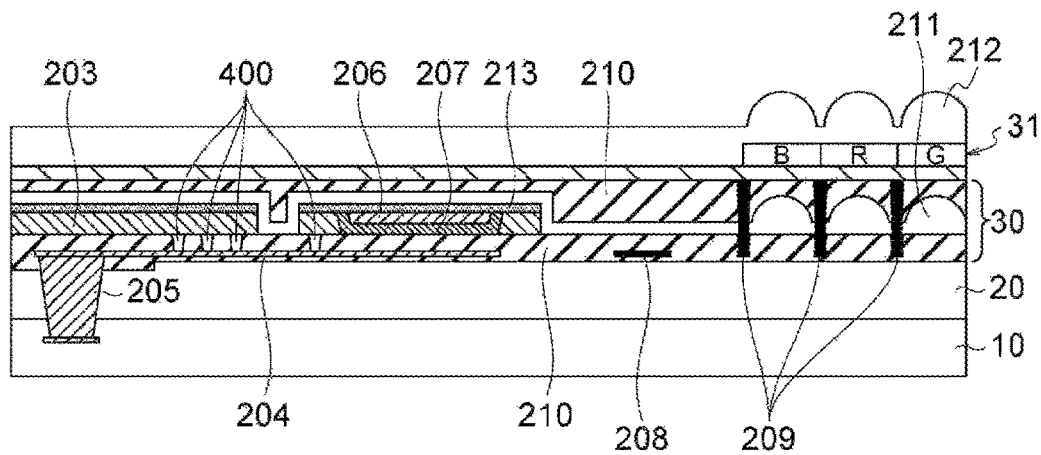
FIGS. 13A, 13B, and 13C are diagrams for explaining a method for manufacturing a solid-state imaging device to which the present technology is applied.
Figure 13B:
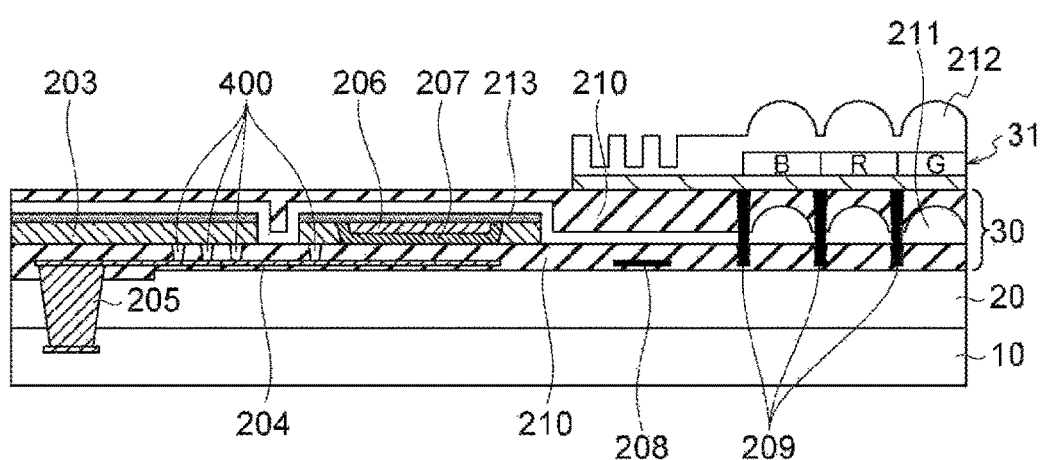

(FIG. 12B), light blocking portions for forming light blocking walls 209 are formed with a photoresist and by dry etching, and tungsten (W) films or the like are formed, so that the light blocking walls 209 are formed (FIG. 12C). After that, color filters (a blue-light color filter, a red-light color filter, and a green-light color filter, for example) 31 and on-chip lenses (OCLs) 212 are formed (FIGS. 13A and 13B). The opening 201 for the second connecting portion (wire bonding pad (WB PAD)) is formed, so that the second connecting portion 201a (wire bonding pad (WB PAD)) is formed. The opening 202 for the first connecting portion (bump pad (Bump PAD) is formed, so that the first connecting portion 202a (bump pad (Bump PAD)) is formed. Thus, the solid-state imaging device 2003 is manufactured (FIG. 13C).

Figure 13C:
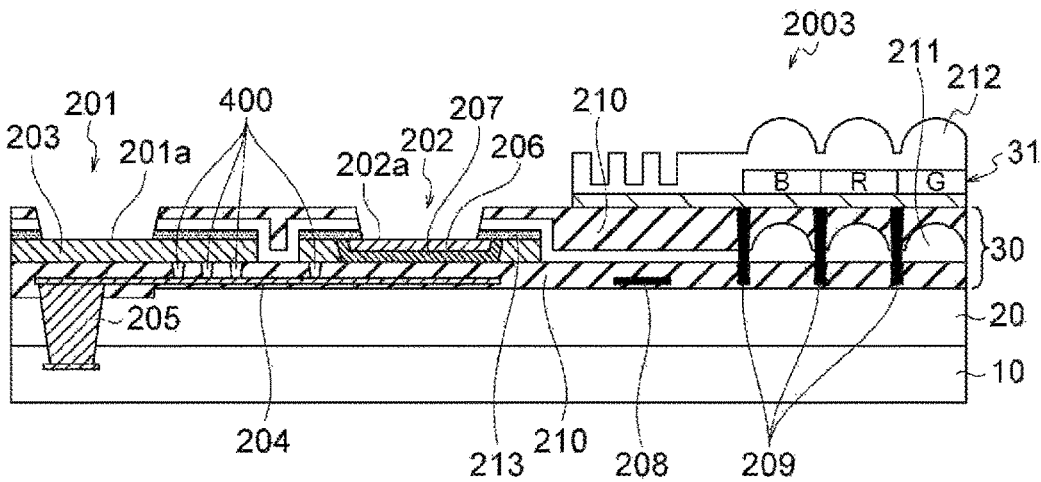

As shown in FIG. 13C, in the solid-state imaging device 2003, the connecting wiring line includes the first wiring line 204, the second wiring line 203, and a plurality (four) of contact vias 400. A penetrating via 205 and the first connecting portion 202a are connected to each other via the first wiring line 204, one contact via 400, and the second wiring line 203. Also, the penetrating via 205 and the second connecting portion 201a are connected to each other via the first wiring line 204, three contact vias 400, and the second wiring line 203. As the connecting wiring line includes the contact vias 400, the solid-state imaging device 2003 can be made smaller in height (or thinner). With the use of the contact vias 400, there is no need to form the groove for connecting the first wiring line 204 and the second wiring line 203 as described above in some cases. The groove is formed so that the second wiring line 203 extends downward (the direction toward the surface side of the semiconductor layer 20), and the second wiring line 203 is connected to the first wiring line 204. For example, in a case where the groove needs to extend downward from the second wiring line 203 to obtain manufacturing suitability, the length of the contact vias 400 may be smaller than the length (depth) of the groove, and thus, the solid-state imaging device 2003 can be made even smaller in height (or thinner). Further, as the solid-state imaging device 2003 has the contact vias 400, the second wiring line 203 does not need to continuously extend from the first connecting portion 202a to the second connecting portion 201a, and is divided in the vertical direction (the vertical direction in FIG. 13C) by the insulating film 210, as shown in FIG. 13C.

Next, a solid-state imaging device of the third embodiment according to the present technology is described with reference to FIG. 18.

As shown in FIG. 18, a solid-state imaging device 2008 is a solid-state imaging device that has substantially the same structure as the solid-state imaging device 2003, except for not including the light blocking walls 209 included in the solid-state imaging device 2003. Therefore, detailed explanation of the structure of the solid-state imaging device 2008 is not made herein.

In addition to the contents described above, the contents explained in the description of the solid-state imaging devices of the first embodiment according to the present technology can be applied, without any change, to the solid-state imaging devices of the third embodiment according to the present technology, unless there is some technical contradiction.

5. Fourth Embodiment (Example 4 of a Solid-State Imaging Device)

A solid-state imaging device of a fourth embodiment (Example 4 of a solid-state imaging device) according to the present technology includes: a first semiconductor device including a semiconductor layer in which a photoelectric conversion unit that photoelectrically converts incident light and a penetrating via are provided, a first connecting portion and a second connecting portion on the light receiving surface side of the semiconductor layer, and a connecting wiring line that connects the first connecting portion, the second connecting portion, and the penetrating via; and a second semiconductor device that is mounted on the first semiconductor device with the first connecting portion. The solid-state imaging device is connected to an external terminal by the second connecting portion, and the first connecting portion is buried in a recessed structure included in a second wiring line. In the solid-state imaging device of the fourth embodiment according to the present technology, the first connecting portion is buried in the recessed structure included in the second wiring line, and the upper surface of the first connecting portion and the upper surface of the second wiring line may be in substantially the same plane.

Figure 14:
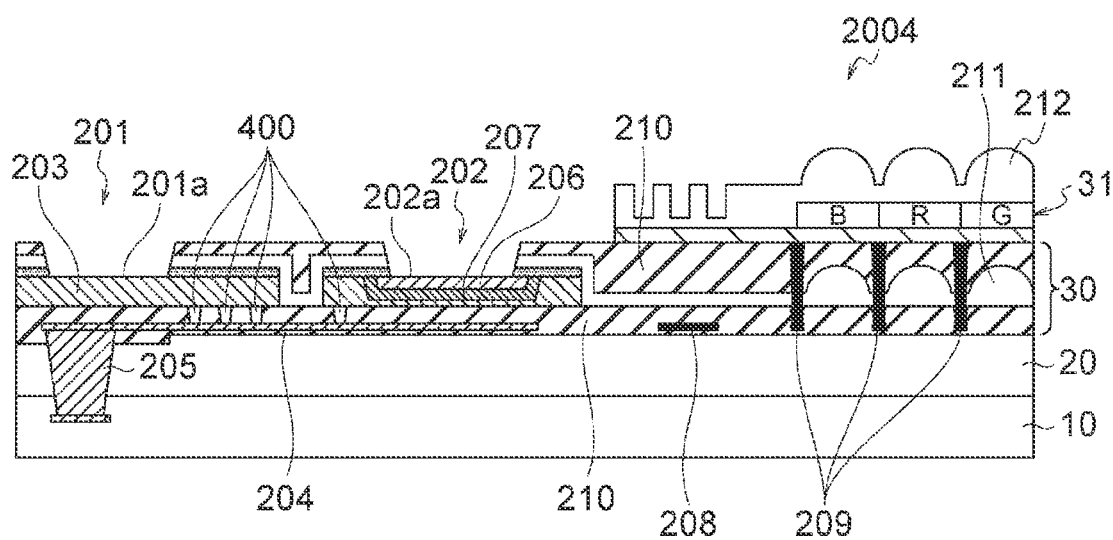
FIG. 14 is a diagram showing an example configuration of a solid-state imaging device to which the present technology is applied.
Figure 19:
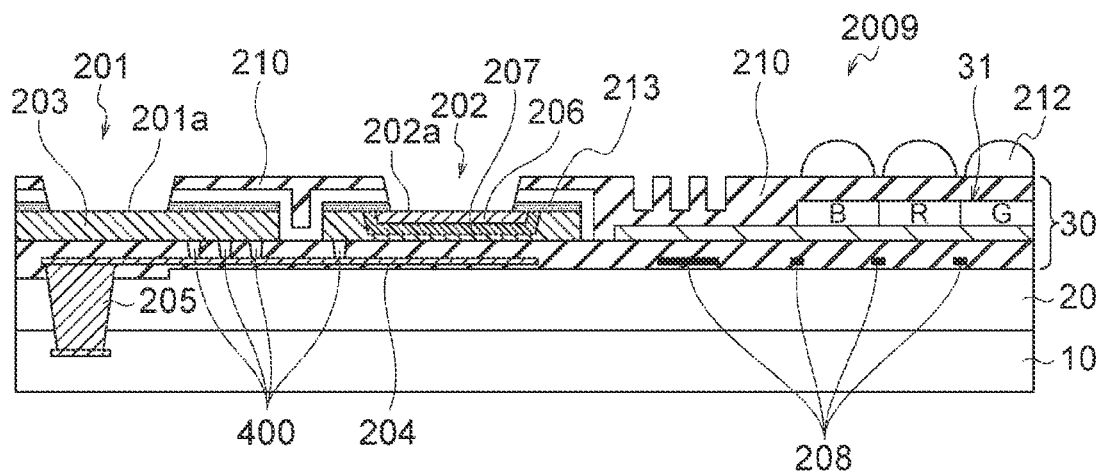
FIG. 19 is a diagram showing an example configuration of a solid-state imaging device to which the present technology is applied.

In the description below, a solid-state imaging device of the fourth embodiment according to the present technology is explained in greater detail, with reference to FIG. 14 and FIG. 19. FIGS. 14 and 19 are diagrams each showing an example configuration of a solid-state imaging device of the fourth embodiment according to the present technology. FIG. 14 is a cross-sectional view of a solid-state imaging device 2004, and FIG. 19 is a cross-sectional view of a solid-state imaging device 2009.

Referring now to FIG. 14, a solid-state imaging device of the fourth embodiment according to the present technology is described.

As shown in FIG. 14, in the solid-state imaging device 2004, a first connecting portion 202a is formed by burying an aluminum-containing layer 207 and a copper-containing layer 206 in a recessed structure included in a second wiring line 203. As the first connecting portion 202a is buried in the recessed structure of the second wiring line 203, the upper surface (the connecting surface) (the upper side in FIG. 14) of the first connecting portion 202a and the upper surface (the upper side in FIG. 14) of the second wiring line 203 are in substantially the same plane. Note that, as shown in FIG. 14, in the solid-state imaging device 2004, the second wiring line 203 has the recessed structure at the lower portion (the lower side in FIG. 14) of the first connecting portion 202a, and therefore, the second wiring line 203 is left. However, the recessed structure may be dug deeper to reach the insulating film 210, and the second wiring line 203 may not be left at the lower portion (the lower side in FIG. 14) of the first connecting portion 202a.

Next, a solid-state imaging device of the fourth embodiment according to the present technology is described with reference to FIG. 19.

As shown in FIG. 19, a solid-state imaging device 2009 is a solid-state imaging device that has substantially the same structure as the solid-state imaging device 2004, except for not including the light blocking walls 209 included in the solid-state imaging device 2004. Therefore, detailed explanation of the structure of the solid-state imaging device 2009 is not made herein.

In addition to the contents described above, the contents explained in the description of the solid-state imaging devices of the first embodiment according to the present technology can be applied, without any change, to the solid-state imaging devices of the fourth embodiment according to the present technology, unless there is some technical contradiction.

6. Fifth Embodiment (Example 5 of a Solid-State Imaging Device)

A solid-state imaging device of a fifth embodiment (Example 5 of a solid-state imaging device) according to the present technology includes: a first semiconductor device including a semiconductor layer in which a photoelectric conversion unit that photoelectrically converts incident light and a penetrating via are provided, a first connecting portion and a second connecting portion on the light receiving surface side of the semiconductor layer, and a connecting wiring line that connects the first connecting portion, the second connecting portion, and the penetrating via; and a second semiconductor device that is mounted on the first semiconductor device with the first connecting portion. The solid-state imaging device is connected to an external terminal by the second connecting portion, the connecting wiring line includes a first wiring line, a second wiring line, a plurality of first contact vias, and a plurality of second contact vias, the penetrating via and the first connecting portion are connected to each other via the first wiring line and at least one of the plurality of first contact vias, and the penetrating via and the second connecting portion are connected to each other via the first wiring line, at least one of the plurality of second contact vias, and the second wiring line.

Figure 15:
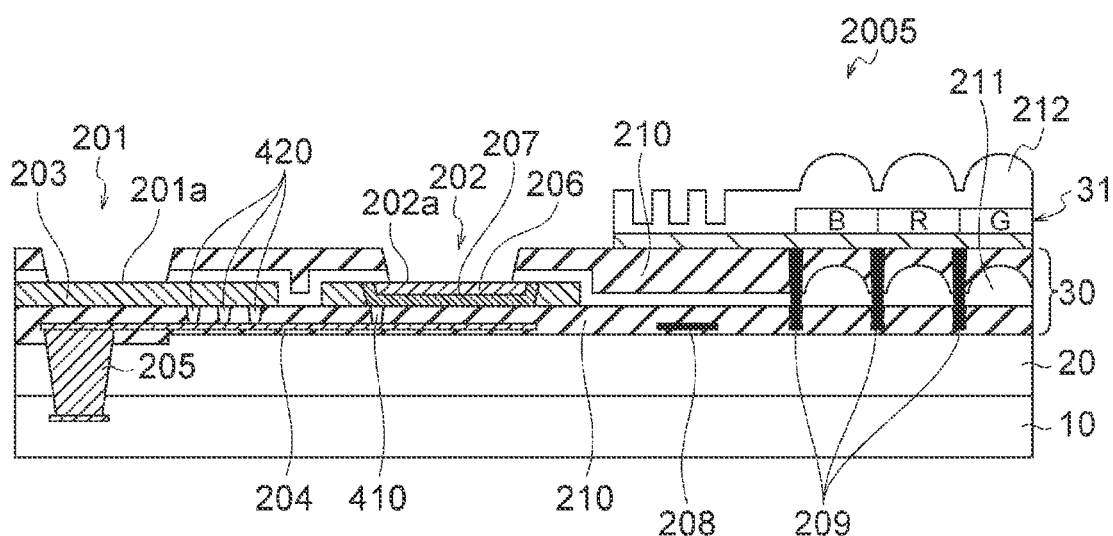
FIG. 15 is a diagram showing an example configuration of a solid-state imaging device to which the present technology is applied.
Figure 20:
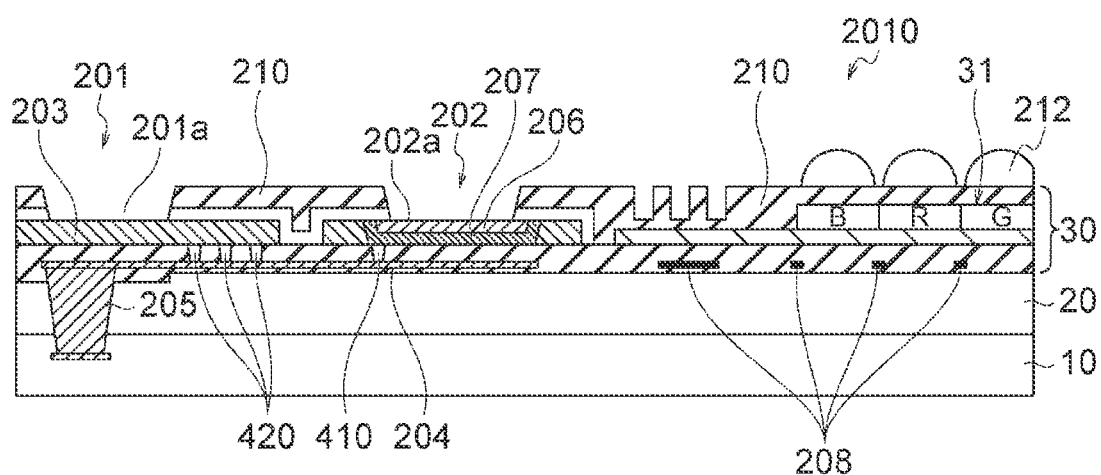
FIG. 20 is a diagram showing an example configuration of a solid-state imaging device to which the present technology is applied.

In the description below, a solid-state imaging device of the fifth embodiment according to the present technology is explained in greater detail, with reference to FIG. 15 and FIG. 20. FIGS. 15 and 20 are diagrams each showing an example configuration of a solid-state imaging device of the fifth embodiment according to the present technology. FIG. 15 is a cross-sectional view of a solid-state imaging device 2005, and FIG. 20 is a cross-sectional view of a solid-state imaging device 2010.

Referring now to FIG. 15, a solid-state imaging device of the fifth embodiment according to the present technology is described.

As shown in FIG. 15, in the solid-state imaging device 2005, the connecting wiring line includes a first wiring line 204, a second wiring line 203, one first contact via 410, and three second contact vias 420. A penetrating via 205 and a first connecting portion 202a are connected to each other via the first wiring line 204 and the one first contact via 410. That is, the penetrating via 205 and the first connecting portion 202a are connected to each other, as the first contact via 410 is connected directly to the first connecting portion 202a without the second wiring line 203. Further, the penetrating via 205 and the second connecting portion 201a are connected to each other via the first wiring line 204, the three second contact vias 420, and the second wiring line 203.

Next, a solid-state imaging device of the fifth embodiment according to the present technology is described with reference to FIG. 20.

As shown in FIG. 20, a solid-state imaging device 2010 is a solid-state imaging device that has substantially the same structure as the solid-state imaging device 2005, except for not including the light blocking walls 209 included in the solid-state imaging device 2005. Therefore, detailed explanation of the structure of the solid-state imaging device 2010 is not made herein.

In addition to the contents described above, the contents explained in the description of the solid-state imaging devices of the first embodiment according to the present technology can be applied, without any change, to the solid-state imaging devices of the fifth embodiment according to the present technology, unless there is some technical contradiction.

7. Sixth Embodiment (an Example of an Electronic Apparatus)

An electronic apparatus of a sixth embodiment according to the present technology is an electronic apparatus in which a solid-state imaging device according to the present technology is mounted, and the solid-state imaging device according to the present technology is a solid-state imaging device that includes: a first semiconductor device including a semiconductor layer in which a photoelectric conversion unit that photoelectrically converts incident light and a penetrating via are provided, a first connecting portion and a second connecting portion on the surface side of the semiconductor layer on the side that receives the light, and a connecting wiring line that connects the first connecting portion, the second connecting portion, and the penetrating via; and a second semiconductor device that is mounted on the first semiconductor device with the first connecting portion. The solid-state imaging device is connected to an external terminal by the second connecting portion.

For example, an electronic apparatus of the sixth embodiment according to the present technology is an electronic apparatus in which a solid-state imaging device of one embodiment among the solid-state imaging devices of the first to fifth embodiments according to the present technology is mounted.

Figure 22:
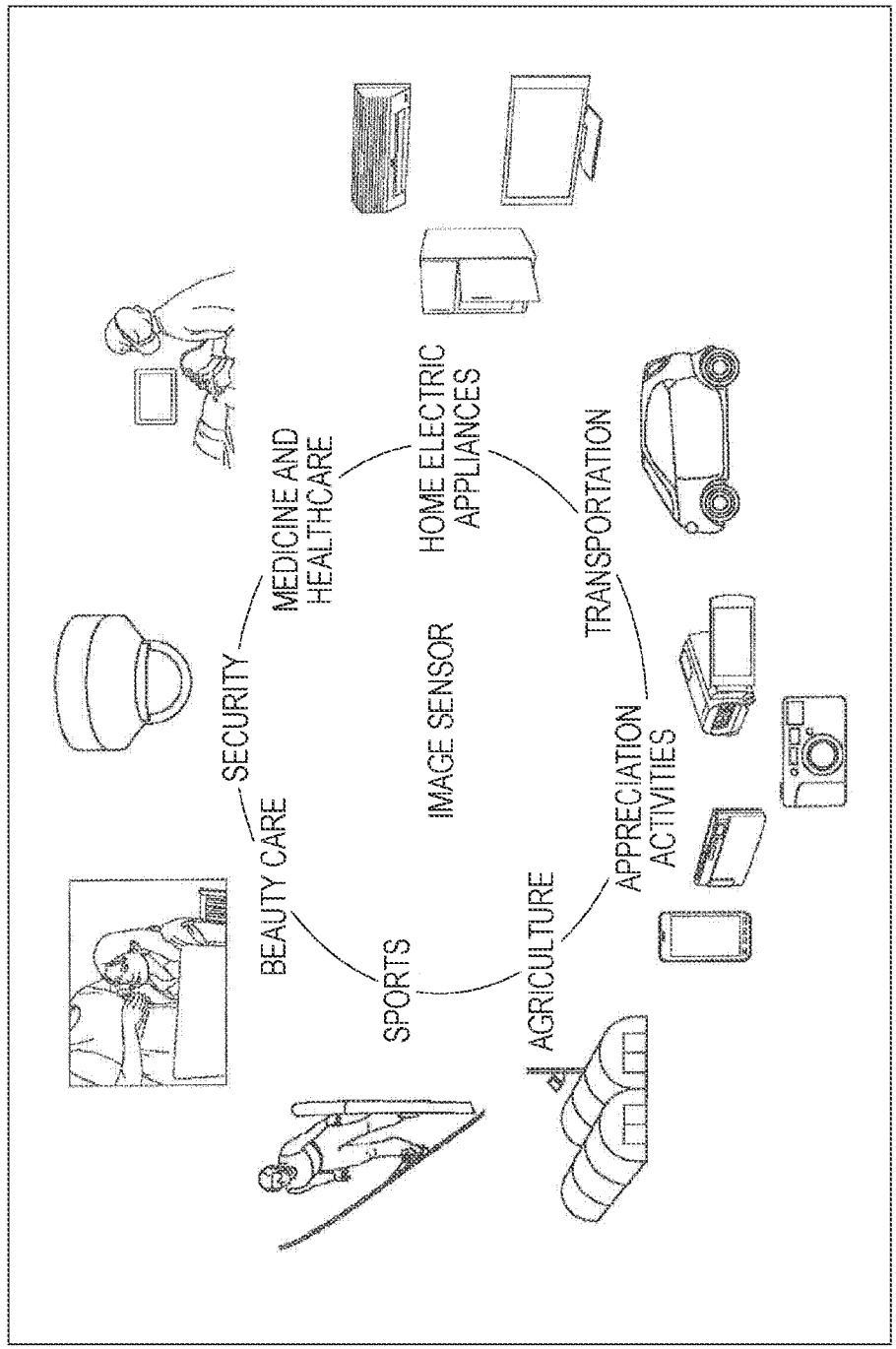
FIG. 22 is a diagram showing examples of use of solid-state imaging devices of first to fifth embodiments to which the present technology is applied.

8. Examples of Use of Solid-State Imaging Devices to which the Present Technology is Applied FIG. 22 is a diagram showing examples of use of solid-state imaging devices of the first to fifth embodiments according to the present technology as image sensors.

Solid-state imaging devices of the first to fifth embodiments described above can be used in various cases where light such as visible light, infrared light, ultraviolet light, or an X-ray is sensed, as described below, for example. That is, as shown in FIG. 22, solid-state imaging devices of any one of the first to fifth embodiments can be used in apparatuses (such as the electronic apparatus of the sixth embodiment described above, for example) that are used in the appreciation activity field where images are taken and are used in appreciation activities, the field of transportation, the field of home electric appliances, the fields of medicine and healthcare, the field of security, the field of beauty care, the field of sports, the field of agriculture, and the like, for example.

Specifically, in the appreciation activity field, a solid-state imaging device of any one of the first to fifth embodiments can be used in an apparatus for capturing images to be used in appreciation activities, such as a digital camera, a smartphone, or a portable telephone with a camera function, for example.

In the field of transportation, a solid-state imaging device of any one of the first to fifth embodiments can be used in an apparatus for transportation use, such as a vehicle-mounted sensor designed to capture images of the front, the back, the surroundings, the inside, and the like of an automobile, to perform safe driving such as an automatic stop and recognize the driver's condition or the like, a surveillance camera for monitoring running vehicles and roads, or a ranging sensor for measuring distances between vehicles or the like, for example.

In the field of home electric appliances, a solid-state imaging device of any one of the first to fifth embodiments can be used in an apparatus to be used as home electric appliances, such as a television set, a refrigerator, or an air conditioner, to capture images of gestures of users and operate the apparatus in accordance with the gestures, for example.

In the fields of medicine and healthcare, a solid-state imaging device of any one of the first to fifth embodiments can be used in an apparatus for medical use or healthcare use, such as an endoscope or an apparatus for receiving infrared light for angiography, for example.

In the field of security, a solid-state imaging device of any one of the first to fifth embodiments can be used in an apparatus for security use, such as a surveillance camera for crime prevention or a camera for personal authentication, for example.

In the field of beauty care, a solid-state imaging device of any one of the first to fifth embodiments can be used in an apparatus for beauty care use, such as a skin measurement apparatus designed to capture images of the skin or a microscope for capturing images of the scalp, for example.

In the field of sports, a solid-state imaging device of any one of the first to fifth embodiments can be used in an apparatus for sporting use, such as an action camera or a wearable camera for sports or the like, for example.

In the field of agriculture, a solid-state imaging device of any one of the first to fifth embodiments can be used in an apparatus for agricultural use, such as a camera for monitoring conditions of fields and crops, for example.

Figure 23:
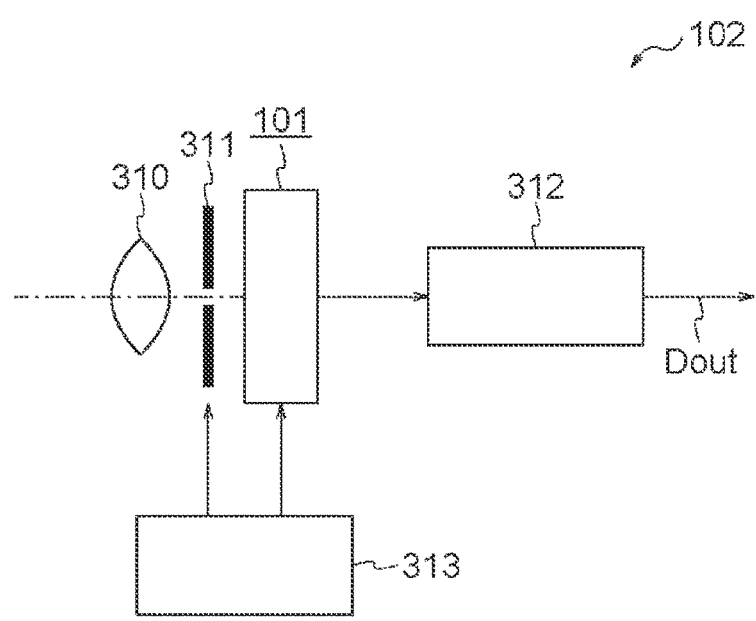
FIG. 23 is a functional block diagram of an example of an electronic apparatus according to a sixth embodiment to which the present technology is applied.

Next, examples of use of solid-state imaging devices of the first to fifth embodiments according to the present technology are specifically described. For example, a solid-state imaging device of any one of the first to fifth embodiments described above can be used as a solid-state imaging device 101 in an electronic apparatus of any type having an imaging function, such as a camera system like a digital still camera or a video camera, or a portable telephone having an imaging function. FIG. 23 shows a schematic configuration of an electronic apparatus 102 (a camera) as an example. This electronic apparatus 102 is a video camera capable of capturing a still image or a moving image, for example, and includes the solid-state imaging device 101, an optical system (an optical lens) 310, a shutter device 311, a drive unit 313 that drives the solid-state imaging device 101 and the shutter device 311, and a signal processing unit 312.

The optical system 310 guides image light (incident light) from the object to a pixel unit 101a of the solid-state imaging device 101. This optical system 310 may be formed with a plurality of optical lenses. The shutter device 311 controls the light irradiation period and the light blocking period for the solid-state imaging device 101. The drive unit 313 controls transfer operations of the solid-state imaging device 101 and shutter operations of the shutter device 311. The signal processing unit 312 performs various kinds of signal processing on a signal output from the solid-state imaging device 101. A video signal Dout subjected to the signal processing is stored into a storage medium such as a memory, or is output to a monitor or the like.

9. Example Application to an Endoscopic Surgery System

The present technology can be applied to various products. For example, the technology (the present technology) according to the present disclosure may be applied to an endoscopic surgery system.

Figure 24:
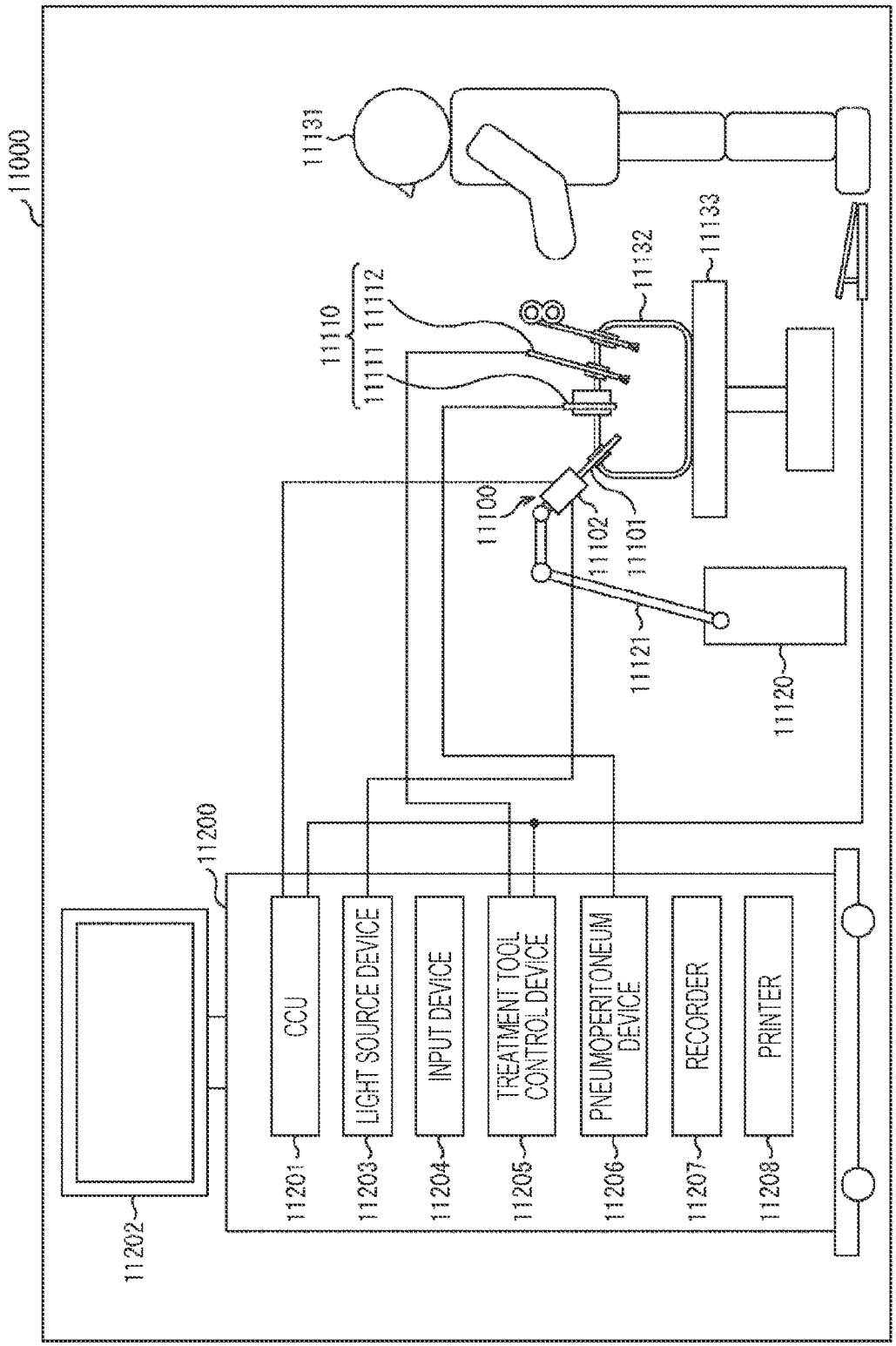
FIG. 24 is a diagram schematically showing an example configuration of an endoscopic surgery system.

FIG. 24 is a diagram schematically showing an example configuration of an endoscopic surgery system to which the technology (the present technology) according to the present disclosure can be applied.

FIG. 24 shows a situation where a surgeon (a physician) 11131 is performing surgery on a patient 11132 on a patient bed 11133, using an endoscopic surgery system 11000. As shown in the drawing, the endoscopic surgery system 11000 includes an endoscope 11100, other surgical tools 11110 such as a pneumoperitoneum tube 11111 and an energy treatment tool 11112, a support arm device 11120 that supports the endoscope 11100, and a cart 11200 on which various kinds of devices for endoscopic surgery are mounted.

The endoscope 11100 includes a lens barrel 11101 that has a region of a predetermined length from the top end to be inserted into a body cavity of the patient 11132, and a camera head 11102 connected to the base end of the lens barrel 11101. In the example shown in the drawing, the endoscope 11100 is designed as a so-called rigid scope having a rigid lens barrel 11101. However, the endoscope 11100 may be designed as a so-called flexible scope having a flexible lens barrel.

At the top end of the lens barrel 11101, an opening into which an objective lens is inserted is provided. A light source device 11203 is connected to the endoscope 11100, and the light generated by the light source device 11203 is guided to the top end of the lens barrel by a light guide extending inside the lens barrel 11101, and is emitted toward the current observation target in the body cavity of the patient 11132 via the objective lens. Note that the endoscope 11100 may be a forward-viewing endoscope, an oblique-viewing endoscope, or a side-viewing endoscope.

An optical system and an imaging device are provided inside the camera head 11102, and reflected light (observation light) from the current observation target is converged on the imaging device by the optical system. The observation light is photoelectrically converted by the imaging device, and an electrical signal corresponding to the observation light, or an image signal corresponding to the observation image, is generated. The image signal is transmitted as RAW data to a camera control unit (CCU) 11201.

The CCU 11201 is formed with a central processing unit (CPU), a graphics processing unit (GPU), or the like, and collectively controls operations of the endoscope 11100 and a display device 11202. Further, the CCU 11201 receives an image signal from the camera head 11102, and subjects the image signal to various kinds of image processing, such as a development process (a demosaicing process), for example, to display an image based on the image signal.

Under the control of the CCU 11201, the display device 11202 displays an image based on the image signal subjected to the image processing by the CCU 11201.

The light source device 11203 is formed with a light source such as a light emitting diode (LED), for example, and supplies the endoscope 11100 with illuminating light for imaging the surgical site or the like.

An input device 11204 is an input interface to the endoscopic surgery system 11000. The user can input various kinds of information and instructions to the endoscopic surgery system 11000 via the input device 11204. For example, the user inputs an instruction or the like to change imaging conditions (such as the type of illuminating light, the magnification, and the focal length) for the endoscope 11100.

A treatment tool control device 11205 controls driving of the energy treatment tool 11112 for tissue cauterization, incision, blood vessel sealing, or the like. A pneumoperitoneum device 11206 injects a gas into a body cavity of the patient 11132 via the pneumoperitoneum tube 11111 to inflate the body cavity, for the purpose of securing the field of view of the endoscope 11100 and the working space of the surgeon. A recorder 11207 is a device capable of recording various kinds of information about the surgery. A printer 11208 is a device capable of printing various kinds of information relating to the surgery in various formats such as text, images, graphics, and the like.

Note that the light source device 11203 that supplies the endoscope 11100 with the illuminating light for imaging the surgical site can be formed with an LED, a laser light source, or a white light source that is a combination of an LED and a laser light source, for example. In a case where a white light source is formed with a combination of RGB laser light sources, the output intensity and the output timing of each color (each wavelength) can be controlled with high precision. Accordingly, the white balance of an image captured by the light source device 11203 can be adjusted. Alternatively, in this case, laser light from each of the RGB laser light sources may be emitted onto the current observation target in a time-division manner, and driving of the imaging device of the camera head 11102 may be controlled in synchronization with the timing of the light emission. Thus, images corresponding to the respective RGB colors can be captured in a time-division manner. According to the method, a color image can be obtained without any color filter provided in the imaging device.

Further, the driving of the light source device 11203 may also be controlled so that the intensity of light to be output is changed at predetermined time intervals. The driving of the imaging device of the camera head 11102 is controlled in synchronism with the timing of the change in the intensity of the light, and images are acquired in a time-division manner and are then combined. Thus, a high dynamic range image with no black portions and no white spots can be generated.

Further, the light source device 11203 may also be designed to be capable of supplying light of a predetermined wavelength band compatible with special light observation. In special light observation, light of a narrower band than the illuminating light (or white light) at the time of normal observation is emitted, with the wavelength dependence of light absorption in body tissue being taken advantage of, for example. As a result, so-called narrow band light observation (narrow band imaging) is performed to image predetermined tissue such as a blood vessel in a mucosal surface layer or the like, with high contrast. Alternatively, in the special light observation, fluorescence observation for obtaining an image with fluorescence generated through emission of excitation light may be performed. In fluorescence observation, excitation light is emitted to body tissue so that the fluorescence from the body tissue can be observed (autofluorescence observation). Alternatively, a reagent such as indocyanine green (ICG) is locally injected into body tissue, and excitation light corresponding to the fluorescence wavelength of the reagent is emitted to the body tissue so that a fluorescent image can be obtained, for example. The light source device 11203 can be designed to be capable of supplying narrow band light and/or excitation light compatible with such special light observation.

Figure 25:
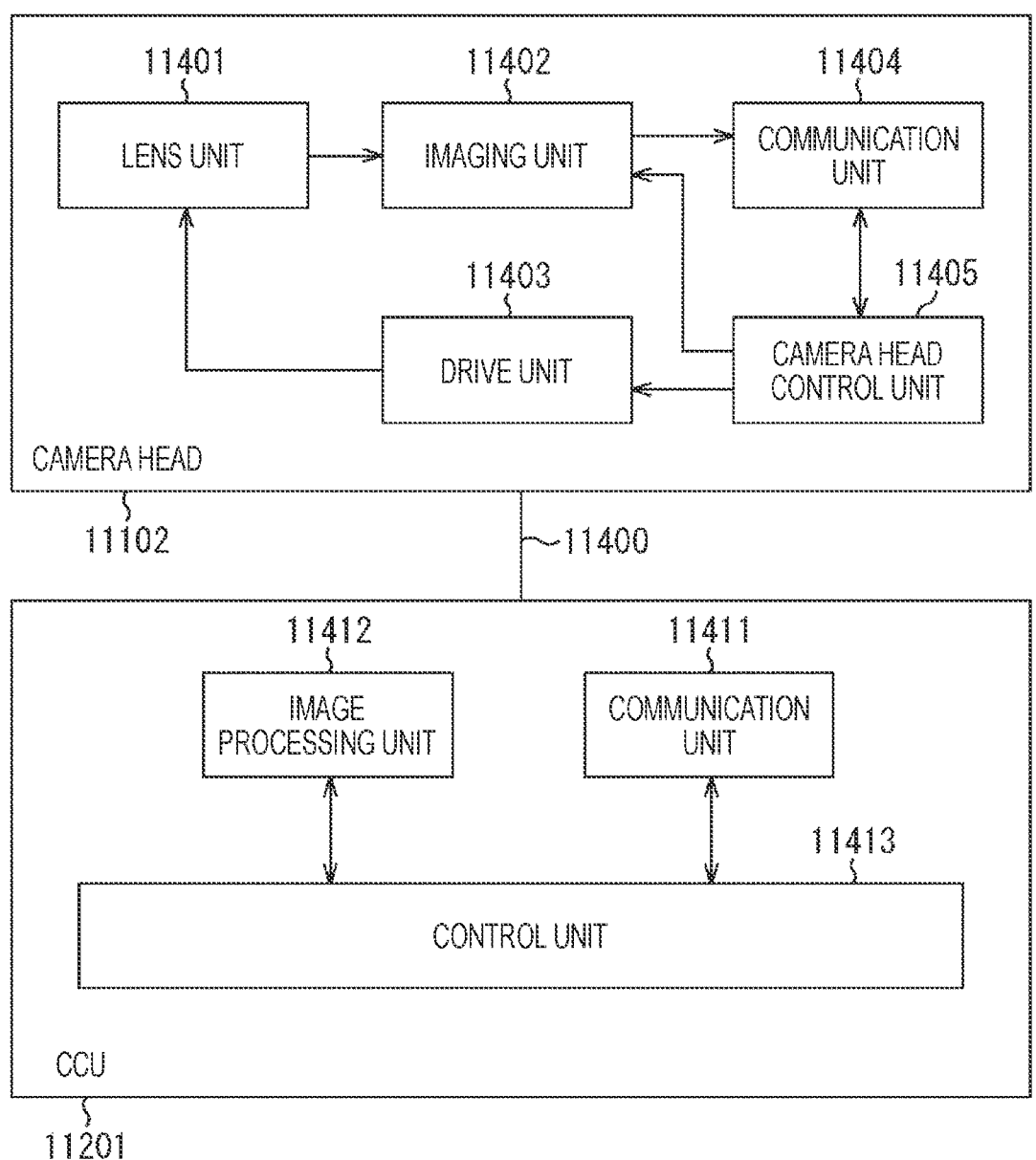
FIG. 25 is a block diagram showing an example of the functional configurations of a camera head and a CCU.

FIG. 25 is a block diagram showing an example of the functional configurations of the camera head 11102 and the CCU 11201 shown in FIG. 24.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at the connecting portion with the lens barrel 11101. Observation light captured from the top end of the lens barrel 11101 is guided to the camera head 11102, and enters the lens unit 11401. The lens unit 11401 is formed with a combination of a plurality of lenses including a zoom lens and a focus lens.

The imaging unit 11402 is formed with an imaging device. The imaging unit 11402 may be formed with one imaging device (a so-called single-plate type), or may be formed with a plurality of imaging devices (a so-called multiple-plate type). In a case where the imaging unit 11402 is of a multiple-plate type, for example, image signals corresponding to the respective RGB colors may be generated by the respective imaging devices, and be then combined to obtain a color image. Alternatively, the imaging unit 11402 may be designed to include a pair of imaging devices for acquiring right-eye and left-eye image signals compatible with three-dimensional (3D) display. As the 3D display is conducted, the surgeon 11131 can grasp more accurately the depth of the body tissue at the surgical site. Note that, in a case where the imaging unit 11402 is of a multiple-plate type, a plurality of lens units 11401 is provided for the respective imaging devices.

Further, the imaging unit 11402 is not necessarily provided in the camera head 11102. For example, the imaging unit 11402 may be provided immediately behind the objective lens in the lens barrel 11101.

The drive unit 11403 is formed with an actuator, and, under the control of the camera head control unit 11405, moves the zoom lens and the focus lens of the lens unit 11401 by a predetermined distance along the optical axis. With this arrangement, the magnification and the focal point of the image captured by the imaging unit 11402 can be adjusted as appropriate.

The communication unit 11404 is formed with a communication device for transmitting and receiving various kinds of information to and from the CCU 11201. The communication unit 11404 transmits the image signal obtained as RAW data from the imaging unit 11402 to the CCU 11201 via the transmission cable 11400.

The communication unit 11404 also receives a control signal for controlling the driving of the camera head 11102 from the CCU 11201, and supplies the control signal to the camera head control unit 11405. The control signal includes information about imaging conditions, such as information for specifying the frame rate of captured images, information for specifying the exposure value at the time of imaging, and/or information for specifying the magnification and the focal point of captured images, for example.

Note that the above imaging conditions such as the frame rate, the exposure value, the magnification, and the focal point may be appropriately specified by the user, or may be automatically set by the control unit 11413 of the CCU 11201 on the basis of an acquired image signal. In the latter case, the endoscope 11100 has a so-called auto-exposure (AE) function, an auto-focus (AF) function, and an auto-white-balance (AWB) function.

The camera head control unit 11405 controls the driving of the camera head 11102, on the basis of a control signal received from the CCU 11201 via the communication unit 11404.

The communication unit 11411 is formed with a communication device for transmitting and receiving various kinds of information to and from the camera head 11102. The communication unit 11411 receives an image signal transmitted from the camera head 11102 via the transmission cable 11400.

Further, the communication unit 11411 also transmits a control signal for controlling the driving of the camera head 11102, to the camera head 11102. The image signal and the control signal can be transmitted through electrical communication, optical communication, or the like.

The image processing unit 11412 performs various kinds of image processing on an image signal that is RAW data transmitted from the camera head 11102.

The control unit 11413 performs various kinds of control relating to display of an image of the surgical portion or the like captured by the endoscope 11100, and a captured image obtained through imaging of the surgical site or the like. For example, the control unit 11413 generates a control signal for controlling the driving of the camera head 11102.

Further, the control unit 11413 also causes the display device 11202 to display a captured image showing the surgical site or the like, on the basis of the image signal subjected to the image processing by the image processing unit 11412. In doing so, the control unit 11413 may recognize the respective objects shown in the captured image, using various image recognition techniques. For example, the control unit 11413 can detect the shape, the color, and the like of the edges of an object shown in the captured image, to recognize the surgical tool such as forceps, a specific body site, bleeding, the mist at the time of use of the energy treatment tool 11112, and the like. When causing the display device 11202 to display the captured image, the control unit 11413 may cause the display device 11202 to superimpose various kinds of surgery aid information on the image of the surgical site on the display, using the recognition result. As the surgery aid information is superimposed and displayed, and thus, is presented to the surgeon 11131, it becomes possible to reduce the burden on the surgeon 11131, and enable the surgeon 11131 to proceed with the surgery in a reliable manner.

The transmission cable 11400 connecting the camera head 11102 and the CCU 11201 is an electrical signal cable compatible with electric signal communication, an optical fiber compatible with optical communication, or a composite cable thereof.

Here, in the example shown in the drawing, communication is performed in a wired manner using the transmission cable 11400. However, communication between the camera head 11102 and the CCU 11201 may be performed in a wireless manner.

An example of an endoscopic surgery system to which the technique according to the present disclosure can be applied has been described above. The technology according to the present disclosure may be applied to the endoscope 11100, (the imaging unit 11402 of) the camera head 11102, and the like in the configuration described above. Specifically, the solid-state imaging device 111 of the present disclosure can be applied to the imaging unit 10402. As the technology according to the present disclosure is applied to the endoscope 11100, (the imaging unit 11402 of) the camera head 11102, and the like, it is possible to improve the performance and the like of the endoscope 11100, (the imaging unit 11402 of) the camera head 11102, and the like.

Although the endoscopic surgery system has been described as an example herein, the technology according to the present disclosure may be applied to a microscopic surgery system or the like, for example.

10. Example Applications to Mobile Structures

The technology (the present technology) according to the present disclosure can be applied to various products. For example, the technology according to the present disclosure may be embodied as a device mounted on any type of mobile structure, such as an automobile, an electrical vehicle, a hybrid electrical vehicle, a motorcycle, a bicycle, a personal mobility device, an airplane, a drone, a vessel, or a robot.

Figure 26:
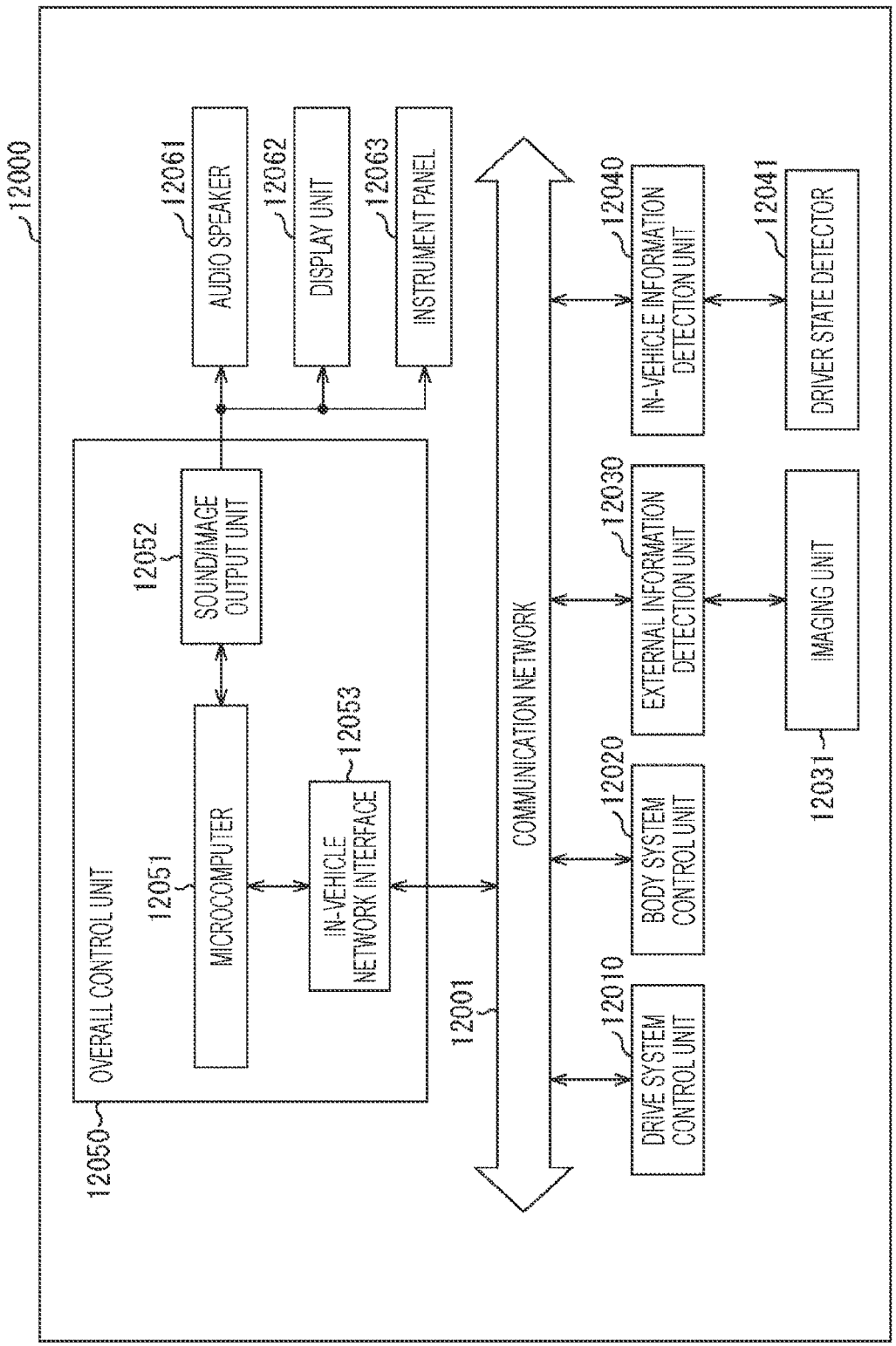
FIG. 26 is a block diagram schematically showing an example configuration of a vehicle control system.

FIG. 26 is a block diagram schematically showing an example configuration of a vehicle control system that is an example of a mobile structure control system to which the technology according to the present disclosure can be applied.

A vehicle control system 12000 includes a plurality of electronic control units connected via a communication network 12001. In the example shown in FIG. 26, the vehicle control system 12000 includes a drive system control unit 12010, a body system control unit 12020, an external information detection unit 12030, an in-vehicle information detection unit 12040, and an overall control unit 12050. Further, a microcomputer 12051, a sound/image output unit 12052, and an in-vehicle network interface (I/F) 12053 are shown as the functional components of the overall control unit 12050.

The drive system control unit 12010 controls operations of the devices related to the drive system of the vehicle according to various programs. For example, the drive system control unit 12010 functions as control devices such as a driving force generation device for generating a driving force of the vehicle such as an internal combustion engine or a driving motor, a driving force transmission mechanism for transmitting the driving force to the wheels, a steering mechanism for adjusting the steering angle of the vehicle, and a braking device for generating a braking force of the vehicle.

The body system control unit 12020 controls operations of the various devices mounted on the vehicle body according to various programs. For example, the body system control unit 12020 functions as a keyless entry system, a smart key system, a power window device, or a control device for various lamps such as a headlamp, a backup lamp, a brake lamp, a turn signal lamp, a fog lamp, or the like. In this case, the body system control unit 12020 can receive radio waves transmitted from a portable device that substitutes for a key, or signals from various switches. The body system control unit 12020 receives inputs of these radio waves or signals, and controls the door lock device, the power window device, the lamps, and the like of the vehicle.

The external information detection unit 12030 detects information outside the vehicle equipped with the vehicle control system 12000. For example, an imaging unit 12031 is connected to the external information detection unit 12030. The external information detection unit 12030 causes the imaging unit 12031 to capture an image of the outside of the vehicle, and receives the captured image. On the basis of the received image, the external information detection unit 12030 may perform an object detection process for detecting a person, a vehicle, an obstacle, a sign, characters on the road surface, or the like, or perform a distance detection process.

The imaging unit 12031 is an optical sensor that receives light, and outputs an electrical signal corresponding to the amount of received light. The imaging unit 12031 can output an electrical signal as an image, or output an electrical signal as distance measurement information. Further, the light to be received by the imaging unit 12031 may be visible light, or may be invisible light such as infrared rays.

The in-vehicle information detection unit 12040 detects information about the inside of the vehicle. For example, a driver state detector 12041 that detects the state of the driver is connected to the in-vehicle information detection unit 12040. The driver state detector 12041 includes a camera that captures an image of the driver, for example, and, on the basis of detected information input from the driver state detector 12041, the in-vehicle information detection unit 12040 may calculate the degree of fatigue or the degree of concentration of the driver, or determine whether or not the driver is dozing off.

On the basis of the external/internal information acquired by the external information detection unit 12030 or the in-vehicle information detection unit 12040, the microcomputer 12051 can calculate the control target value of the driving force generation device, the steering mechanism, or the braking device, and output a control command to the drive system control unit 12010. For example, the microcomputer 12051 can perform cooperative control to achieve the functions of an advanced driver assistance system (ADAS), including vehicle collision avoidance or impact mitigation, follow-up running based on the distance between vehicles, vehicle velocity maintenance running, vehicle collision warning, vehicle lane deviation warning, or the like.

Further, the microcomputer 12051 can also perform cooperative control to conduct automatic driving or the like for autonomously running not depending on the operation of the driver, by controlling the driving force generation device, the steering mechanism, the braking device, or the like on the basis of information about the surroundings of the vehicle, the information having being acquired by the external information detection unit 12030 or the in-vehicle information detection unit 12040.

The microcomputer 12051 can also output a control command to the body system control unit 12020, on the basis of the external information acquired by the external information detection unit 12030. For example, the microcomputer 12051 controls the headlamp in accordance with the position of the leading vehicle or the oncoming vehicle detected by the external information detection unit 12030, and performs cooperative control to achieve an anti-glare effect by switching from a high beam to a low beam, or the like.

The sound/image output unit 12052 transmits an audio output signal and/or an image output signal to an output device that is capable of visually or audibly notifying the passenger(s) of the vehicle or the outside of the vehicle of information. In the example shown in FIGS. 13A, 13B, and 13C, an audio speaker 12061, a display unit 12062, and an instrument panel 12063 are shown as output devices. The display unit 12062 may include an on-board display and/or a head-up display, for example.

Figure 27:
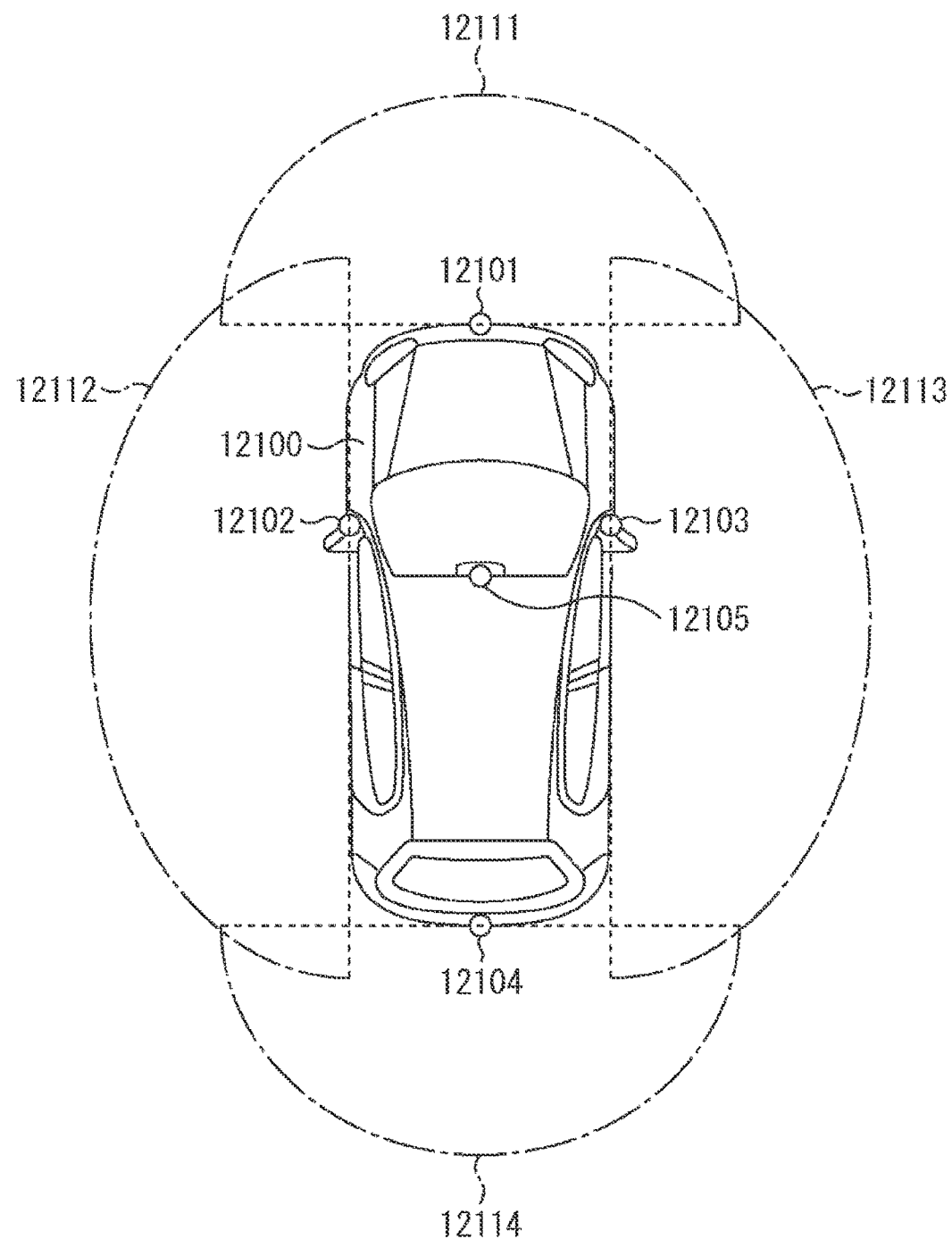
FIG. 27 is an explanatory diagram showing an example of installation positions of external information detectors and imaging units.

FIG. 27 is a diagram showing an example of installation positions of imaging units 12031.

In FIG. 27, a vehicle 12100 includes imaging units 12101, 12102, 12103, 12104, and 12105 as the imaging units 12031.

Imaging units 12101, 12102, 12103, 12104, and 12105 are provided at the following positions: the front end edge of a vehicle 12100, a side mirror, the rear bumper, a rear door, an upper portion of the front windshield inside the vehicle, and the like, for example. The imaging unit 12101 provided on the front end edge and the imaging unit 12105 provided on the upper portion of the front windshield inside the vehicle mainly capture images ahead of the vehicle 12100. The imaging units 12102 and 12103 provided on the side mirrors mainly capture images on the sides of the vehicle 12100. The imaging unit 12104 provided on the rear bumper or a rear door mainly captures images behind the vehicle 12100. The front images acquired by the imaging units 12101 and 12105 are mainly used for detection of a vehicle running in front of the vehicle 12100, a pedestrian, an obstacle, a traffic signal, a traffic sign, a lane, or the like.

Note that FIG. 27 shows an example of the imaging ranges of the imaging units 12101 to 12104. An imaging range 12111 indicates the imaging range of the imaging unit 12101 provided on the front end edge, imaging ranges 12112 and 12113 indicate the imaging ranges of the imaging units 12102 and 12103 provided on the respective side mirrors, and an imaging range 12114 indicates the imaging range of the imaging unit 12104 provided on the rear bumper or a rear door. For example, image data captured by the imaging units 12101 to 12104 are superimposed on one another, so that an overhead image of the vehicle 12100 viewed from above is obtained.

At least one of the imaging units 12101 to 12104 may have a function of acquiring distance information. For example, at least one of the imaging units 12101 to 12104 may be a stereo camera including a plurality of imaging devices, or may be imaging devices having pixels for phase difference detection.

For example, on the basis of distance information obtained from the imaging units 12101 to 12104, the microcomputer 12051 calculates the distances to the respective three-dimensional objects within the imaging ranges 12111 to 12114, and temporal changes in the distances (the velocities relative to the vehicle 12100). In this manner, the three-dimensional object that is the closest three-dimensional object on the traveling path of the vehicle 12100 and is traveling at a predetermined velocity (0 km/h or higher, for example) in substantially the same direction as the vehicle 12100 can be extracted as the vehicle running in front of the vehicle 12100. Further, the microcomputer 12051 can set beforehand an inter-vehicle distance to be maintained in front of the vehicle running in front of the vehicle 12100, and can perform automatic brake control (including follow-up stop control), automatic acceleration control (including follow-up start control), and the like. In this manner, it is possible to perform cooperative control to conduct automatic driving or the like to autonomously travel not depending on the operation of the driver.

For example, in accordance with the distance information obtained from the imaging units 12101 to 12104, the microcomputer 12051 can extract three-dimensional object data concerning three-dimensional objects under the categories of two-wheeled vehicles, regular vehicles, large vehicles, pedestrians, utility poles, and the like, and use the three-dimensional object data in automatically avoiding obstacles. For example, the microcomputer 12051 classifies the obstacles in the vicinity of the vehicle 12100 into obstacles visible to the driver of the vehicle 12100 and obstacles difficult to visually recognize. The microcomputer 12051 then determines collision risks indicating the risks of collision with the respective obstacles. If a collision risk is equal to or higher than a set value, and there is a possibility of collision, the microcomputer 12051 can output a warning to the driver via the audio speaker 12061 and the display unit 12062, or can perform driving support for avoiding collision by performing forced deceleration or avoiding steering via the drive system control unit 12010.

At least one of the imaging units 12101 to 12104 may be an infrared camera that detects infrared rays. For example, the microcomputer 12051 can recognize a pedestrian by determining whether or not a pedestrian exists in images captured by the imaging units 12101 to 12104. Such pedestrian recognition is carried out through a process of extracting feature points from the images captured by the imaging units 12101 to 12104 serving as infrared cameras, and a process of performing a pattern matching on the series of feature points indicating the outlines of objects and determining whether or not there is a pedestrian, for example. If the microcomputer 12051 determines that a pedestrian exists in the images captured by the imaging units 12101 to 12104, and recognizes a pedestrian, the sound/image output unit 12052 controls the display unit 12062 to display a rectangular contour line for emphasizing the recognized pedestrian in a superimposed manner. Further, the sound/image output unit 12052 may also control the display unit 12062 to display an icon or the like indicating the pedestrian at a desired position.

An example of a vehicle control system to which the technology (the present technology) according to the present disclosure may be applied has been described above. The technology according to the present disclosure can be applied to the imaging units 12031 and the like among the components described above, for example. Specifically, the solid-state imaging device 111 of the present disclosure can be applied to the imaging units 12031. As the technique according to the present disclosure is applied to the imaging units 12031, it is possible to improve the performance and the like of the imaging units 12031.

Note that the present technology is not limited to the embodiments, examples of use, and example applications described above, and various modifications may be made to them without departing from the scope of the present technology.

Further, the advantageous effects described in this specification are merely examples, and the advantageous effects of the present technology are not limited to them and may include other effects.

The present technology may also be embodied in the configurations described below.

[1]

A solid-state imaging device including:

a first semiconductor device including: a semiconductor layer in which a photoelectric conversion unit that photoelectrically converts incident light and a penetrating via are provided; a first connecting portion and a second connecting portion on a surface side of the semiconductor layer on a side that receives the light; and a connecting wiring line that connects the first connecting portion, the second connecting portion, and the penetrating via; and a second semiconductor device that is mounted on the first semiconductor device with the first connecting portion, the solid-state imaging device being connected to an external terminal by the second connecting portion.

[2]

The solid-state imaging device according to [1], in which the connecting wiring line includes a first wiring line and a second wiring line, the penetrating via and the second wiring line are connected to each other via the first wiring line, and the first connecting portion and the second connecting portion are connected to each other via the second wiring line.

[3]

The solid-state imaging device according to [1], in which the connecting wiring line includes a first wiring line, a second wiring line, and a plurality of contact vias, the penetrating via and the first connecting portion are connected to each other via the first wiring line, at least one contact via of the plurality of contact vias, and the second wiring line, and the penetrating via and the second connecting portion are connected to each other via the first wiring line, at least one contact via of the plurality of contact vias, and the second wiring line.

[4]

The solid-state imaging device according to [3], in which the second wiring line is vertically divided.

[5]

The solid-state imaging device according to [1], in which the connecting wiring line includes a first wiring line, a second wiring line, a plurality of first contact vias, and a plurality of second contact vias, the penetrating via and the first connecting portion are connected to each other via the first wiring line and at least one first contact via of the plurality of first contact vias, and the penetrating via and the second connecting portion are connected to each other via the first wiring line, at least one second contact via of the plurality of second contact vias, and the second wiring line.

[6]

The solid-state imaging device according to any one of [1] to [5], in which the first connecting portion and the second connecting portion are disposed in substantially the same layer.

[7]

The solid-state imaging device according to any one of [1] to [6], in which the connecting wiring line includes a first wiring line and a second wiring line, and the first connecting portion is buried in a recessed structure included in the second wiring line.

[8]

The solid-state imaging device according to any one of [1] to [6], in which the connecting wiring line includes a first wiring line and a second wiring line, the first connecting portion is buried in a recessed structure included in the second wiring line, and an upper surface of the first connecting portion and an upper surface of the second wiring line are in substantially the same plane.

[9]

The solid-state imaging device according to any one of [1] to [8], in which the first connecting portion has a two-layer structure.

[10]

The solid-state imaging device according to [9], in which the two-layer structure includes a copper-containing layer and a cobalt-containing layer in order from a light incident side.

[11]

The solid-state imaging device according to any one of [1] to [10], in which the second connecting portion includes an aluminum-containing layer.

[12]
An electronic apparatus including
a solid-state imaging device,
the solid-state imaging device including:
a first semiconductor device including: a semiconductor layer in which a photoelectric conversion unit that photoelectrically converts incident light and a penetrating via are provided; a first connecting portion and a second connecting portion on a surface side of the semiconductor layer on a side that receives the light; and a connecting wiring line that connects the first connecting portion, the second connecting portion, and the penetrating via; and
a second semiconductor device that is mounted on the first semiconductor device with the first connecting portion,
the solid-state imaging device being connected to an external terminal by the second connecting portion.

[13]
An electronic apparatus including
the solid-state imaging device according to any one of [1] to [11].

[14]
A solid-state imaging device including:
a first semiconductor device including: a semiconductor layer in which a photoelectric conversion unit that photoelectrically converts incident light and a penetrating via are provided; a first connecting portion; a second connecting portion; and a connecting wiring line that connects the first connecting portion, the second connecting portion, and the penetrating via; and
a second semiconductor device that is mounted on the first semiconductor device with the first connecting portion,
the solid-state imaging device being connected to an external terminal by the second connecting portion,
the connecting wiring line including a first wiring line, a second wiring line, and a plurality of contact vias,
the penetrating via and the first connecting portion being connected to each other via the first wiring line, at least one contact via of the plurality of contact vias, and the second wiring line,
the penetrating via and the second connecting portion being connected to each other via the first wiring line, at least one contact via of the plurality of contact vias, and the second wiring line.

[15]
The solid-state imaging device according to [14], in which the second wiring line is vertically divided.

[16]
A solid-state imaging device including:
a first semiconductor device including: a semiconductor layer in which a photoelectric conversion unit that photoelectrically converts incident light and a penetrating via are provided; a first connecting portion; a second connecting portion; and a connecting wiring line that connects the first connecting portion, the second connecting portion, and the penetrating via; and
a second semiconductor device that is mounted on the first semiconductor device with the first connecting portion,
the solid-state imaging device being connected to an external terminal by the second connecting portion,
the connecting wiring line including a first wiring line, a second wiring line, a plurality of first contact vias, and a plurality of second contact vias,
the penetrating via and the first connecting portion being connected to each other via the first wiring line and at least one first contact via of the plurality of first contact vias,
the penetrating via and the second connecting portion being connected to each other via the first wiring line, at least one second contact via of the plurality of second contact vias, and the second wiring line.

REFERENCE SIGNS LIST

20 Semiconductor layer, second opening
201 Second opening
201a Second connecting portion
202 First opening
202a First connecting portion
203 Second wiring line
204 First wiring line
205 Through hole
1000, 2000 to 2010 Solid-state imaging device

The invention claimed is:
1. A solid-state imaging device, comprising:
a first semiconductor device including:
a semiconductor layer that includes:
a photoelectric conversion unit configured to photoelectrically convert incident light; and
a penetrating via;
a first connecting portion on a surface side of the semiconductor layer, wherein the surface side of the semiconductor layer is configured to receive the incident light;
a second connecting portion on the surface side of the semiconductor layer; and
a connecting wiring line that connects the first connecting portion, the second connecting portion, and the penetrating via, wherein
the connecting wiring line includes a first wiring line and a second wiring line, and
the first connecting portion is in a recessed structure included in the second wiring line; and
a second semiconductor device that is mounted on the first semiconductor device with the first connecting portion, wherein the solid-state imaging device is connected to an external terminal by the second connecting portion.
2. The solid-state imaging device according to claim 1, wherein
the penetrating via is connected to the second wiring line via the first wiring line, and
the first connecting portion is connected to the second connecting portion via the second wiring line.
3. The solid-state imaging device according to claim 1, wherein
the connecting wiring line further includes a plurality of contact vias,
the penetrating via is connected to the first connecting portion via the first wiring line, at least one first contact via of the plurality of contact vias, and the second wiring line, and
the penetrating via is further connected to the second connecting portion via the first wiring line, at least one second contact via of the plurality of contact vias, and the second wiring line.
4. The solid-state imaging device according to claim 3, wherein the second wiring line is vertically divided.
5. The solid-state imaging device according to claim 1, wherein
the connecting wiring line further includes a plurality of first contact vias and a plurality of second contact vias, the penetrating via is connected to the first connecting portion via the first wiring line and at least one first contact via of the plurality of first contact vias, and the penetrating via is further connected to the second connecting portion via the first wiring line, at least one second contact via of the plurality of second contact vias, and the second wiring line.

6. The solid-state imaging device according to claim 1, wherein the first connecting portion and the second connecting portion are in substantially the same layer.

7. The solid-state imaging device according to claim 1, wherein an upper surface of the first connecting portion and an upper surface of the second wiring line are in substantially the same plane.

8. The solid-state imaging device according to claim 1, wherein the first connecting portion has a two-layer structure.

9. The solid-state imaging device according to claim 8, wherein the two-layer structure includes a copper-containing layer and a cobalt-containing layer in order from the surface side of the semiconductor layer.

10. The solid-state imaging device according to claim 1, wherein the second connecting portion includes an aluminum-containing layer.

11. An electronic apparatus, comprising:
a solid-state imaging device including:
   a first semiconductor device including:
      a semiconductor layer that includes:
         a photoelectric conversion unit configured to photoelectrically convert incident light; and
         a penetrating via;
      a first connecting portion on a surface side of the semiconductor layer, wherein the surface side of the semiconductor layer is configured to receive the incident light;
      a second connecting portion on the surface side of the semiconductor layer;
      a connecting wiring line that connects the first connecting portion, the second connecting portion, and the penetrating via, wherein
         the connecting wiring line includes a first wiring line and a second wiring line, and
         the first connecting portion is in a recessed structure included in the second wiring line; and
      a color filter above the semiconductor layer; and
   a second semiconductor device that is mounted on the first semiconductor device with the first connecting portion,
wherein the solid-state imaging device is connected to an external terminal by the second connecting portion.

12. A solid-state imaging device, comprising:
a first semiconductor device including:
   a semiconductor layer that includes:
      a photoelectric conversion unit configured to photoelectrically convert incident light; and
      a penetrating via;
   a first connecting portion on a surface side of the semiconductor layer, wherein
      the surface side of the semiconductor layer is configured to receive the incident light,
      the first connecting portion has a two-layer structure, and
      the two-layer structure includes a copper-containing layer and a cobalt-containing layer in order from the surface side of the semiconductor layer;
   a second connecting portion on the surface side of the semiconductor layer; and
   a connecting wiring line that connects the first connecting portion, the second connecting portion, and the penetrating via; and
a second semiconductor device that is mounted on the first semiconductor device with the first connecting portion,
   wherein the solid-state imaging device is connected to an external terminal by the second connecting portion.

* * * * *